(12) United States Patent
Hung et al.

(10) Patent No.: US 12,733,540 B2
(45) Date of Patent: Sep. 8, 2026

(54) INTEGRATED CIRCUIT PACKAGES, DEVICES USING THE SAME, AND METHODS OF FORMING THE SAME

(71) Applicant: Taiwan Semiconductor Manufacturing Co., Ltd., Hsinchu (TW)

(72) Inventors: Wensen Hung, Zhubei City (TW); Tsung-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 673 days.

(21) Appl. No.: 18/151,040

(22) Filed: Jan. 6, 2023

(65) Prior Publication Data

US 2024/0105530 A1 Mar. 28, 2024

Related U.S. Application Data

(60) Provisional application No. 63/409,451, filed on Sep. 23, 2022.

(51) Int. Cl.

| | |
|---|---|
| ***H10W 76/60*** | (2026.01) |
| ***H10W 40/10*** | (2026.01) |
| ***H10W 40/70*** | (2026.01) |
| ***H10W 42/00*** | (2026.01) |
| ***H10W 90/00*** | (2026.01) |
| *H10W 72/20* | (2026.01) |

(Continued)

(52) U.S. Cl.

CPC ........... *H10W 76/60* (2026.01); *H10W 40/10* (2026.01); *H10W 40/70* (2026.01); *H10W 42/121* (2026.01); *H10W 90/00* (2026.01); *H10W 72/252* (2026.01); *H10W 72/352* (2026.01); *H10W 72/354* (2026.01); *H10W 74/15* (2026.01); *H10W 90/724* (2026.01); *H10W 90/734* (2026.01); *H10W 90/736* (2026.01)

(58) Field of Classification Search

None

See application file for complete search history.

(56) References Cited

U.S. PATENT DOCUMENTS 8,993,380 B2 3/2015 Hou et al.
9,269,694 B2 * 2/2016 Chen .................. H01L 23/3675

(Continued)

FOREIGN PATENT DOCUMENTS

CN 114765142 A 7/2022
TW 201903996 A 1/2019

(Continued)

*Primary Examiner* — Sarah K Salerno

(74) *Attorney, Agent, or Firm* — Slater Matsil, LLP

(57) ABSTRACT

In an embodiment, a device includes: an integrated circuit package including: a package component; and a package stiffener attached to the package component; and a heat spreader attached to the integrated circuit package, a main portion of the heat spreader disposed above the package stiffener, a protruding portion of the heat spreader extending through the package stiffener; an elastic adhesive material between the main portion of the heat spreader and the package stiffener; and a thermal interface material between the protruding portion of the heat spreader and the package component, the thermal interface material different from the elastic adhesive material.

20 Claims, 23 Drawing Sheets

(51) Int. Cl.

| | |
|---|---|
| *H10W 72/30* | (2026.01) |
| *H10W 74/15* | (2026.01) |

(56) References Cited

U.S. PATENT DOCUMENTS

| | | | | |
|---|---|---|---|---|
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,707,177 | B2 | 7/2020 | Huang et al. | |
| 11,756,854 | B2 | 9/2023 | Lin et al. | |
| 2019/0148260 | A1* | 5/2019 | Sikka | H10W 40/22<br>257/713 |
| 2022/0130734 | A1 | 4/2022 | Chiu et al. | |
| 2022/0208624 | A1 | 6/2022 | Kwon et al. | |
| 2023/0078862 | A1* | 3/2023 | Ma | H01L 23/13<br>257/712 |
| 2024/0038617 | A1* | 2/2024 | Hung | H01L 23/3737 |

FOREIGN PATENT DOCUMENTS

| | | | |
|---|---|---|---|
| TW | 202218061 | A | 5/2022 |
| TW | 202229481 | A | 8/2022 |
| TW | I773500 | B | 8/2022 |

* cited by examiner 50
58
52
56
56
50F
56
56
56
54

110/140
100/110A
120B
120A
120B
122
122
116
116
116
116
116
116
116
124
114
112

110/140
100/110A
120B
120A
120B
122
122
116
116
116
116
116
116
116
126
124
114
112

110/140
100/110A
120B
120A
120B
122
122
116
116
116
116
116
116
116
128
126
124
114
112

140
134
136
116
120B
122
120A
100
126
124
114
112
132

200
240
230
230A
230B
238
234
210
218
220
236
232
120B
120A
200R
214
100
216
212

240
238
230
234
210
218
220
236
306
214
302
302P
302M
304
120A
120B
100
216
212

240
238
230
234
210
218
220
236
306
120B
126
262
302
302M
302P
120A
304
214
216
100
212

240
238
230
234
210
268
218
220
236
306
262
302
302P
302M
304
120B
120A
214
100
216
212

240
238
230
234
210
268
218
220
236
306
308
302
302P
302M
304
120B
120A
214
100
216
212

240
230
272
210
218
214
306
308
302
302P
302M
304
120B
120A
100
212

INTEGRATED CIRCUIT PACKAGES, DEVICES USING THE SAME, AND METHODS OF FORMING THE SAME

PRIORITY CLAIM AND CROSS-REFERENCE

This application claims the benefit of U.S. Provisional Application No. 63/409,451, filed on Sep. 23, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
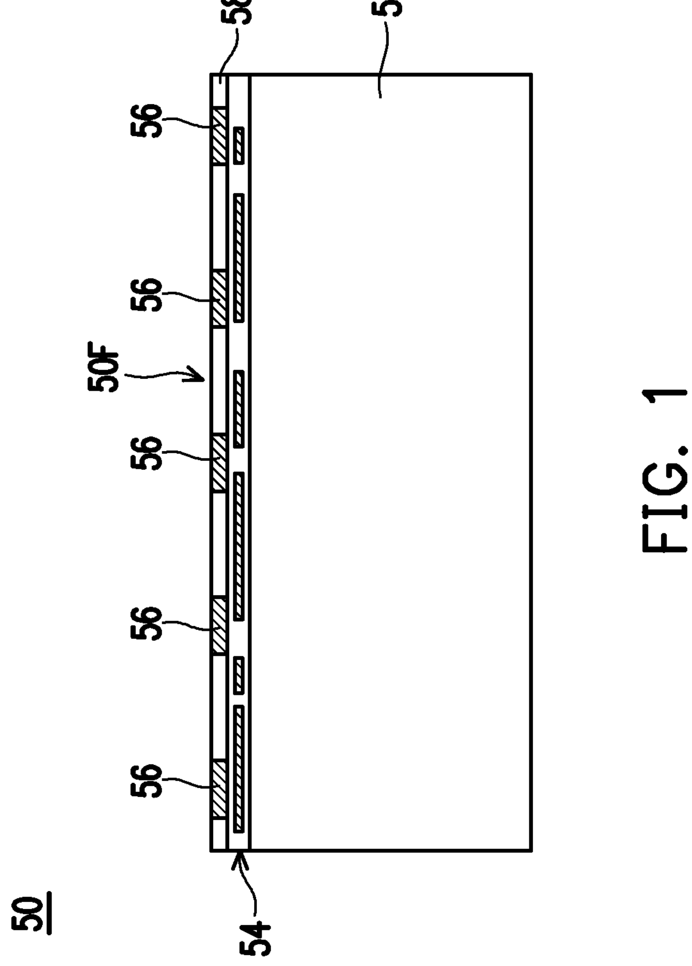
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an integrated circuit package includes a stiffener coupled to a package component of the integrated circuit package. The package component includes memory devices and logic device(s). The stiffener helps reduce warpage of the integrated circuit package. An opening in the stiffener is disposed above the logic device(s) of the package component in a top-down view. The opening allows the integrated circuit package to be implemented in a device by coupling a heat spreader to the logic devices, without the stiffener being in the thermal path between the heat spreader and the logic device(s). The thermal dissipation from the package component of the integrated circuit package may thus be improved.

FIG. 1 is a cross-sectional view of an integrated circuit die 50. Multiple integrated circuit dies 50 will be packaged in subsequent processing to form integrated circuit packages. Each integrated circuit die 50 may be a logic die (e.g., central processing unit (CPU), graphics processing unit (GPU), system-on-a-chip (SoC) die, microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer, such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The metallization layer(s) of the interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 may be exposed through the dielectric layer 58. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2A:
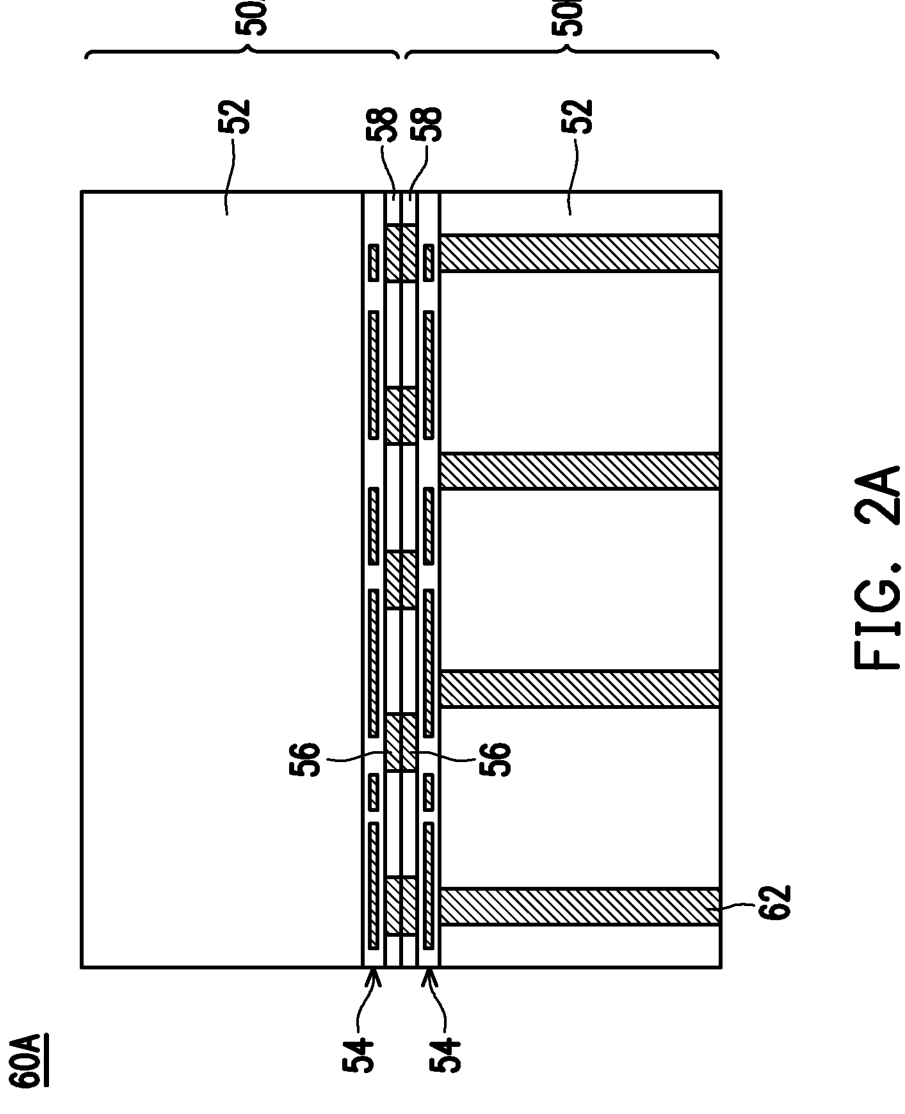
FIGS. 2A-2B are cross-sectional views of die stacks.
Figure 2B:
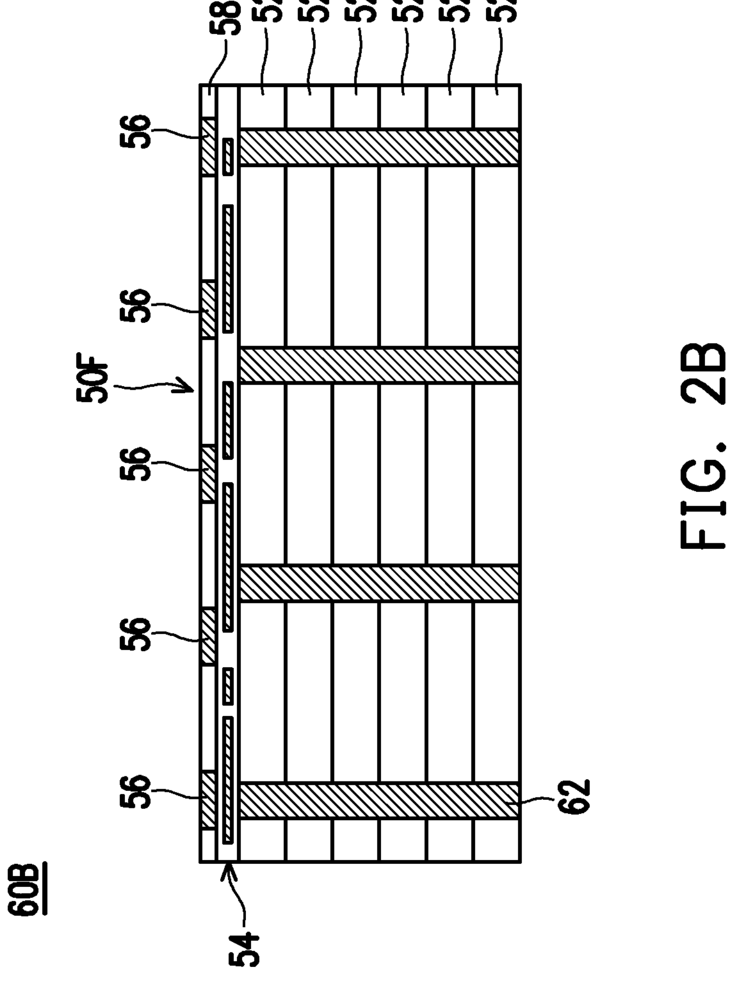

FIGS. 2A-2B are cross-sectional views of die stacks 60A, 60B, respectively. The die stack 60A, 60B may each have a single function (e.g., a logic device, memory die, etc.), or may have multiple functions. In some embodiments, the die stack 60A is a logic device such as a system-on-integrated-chip (SoIC) device and the die stack 60B is a memory device such as high bandwidth memory (HBM) device.

As shown in FIG. 2A, the die stack 60A includes two bonded integrated circuit dies 50 (e.g., a first integrated circuit die 50A and a second integrated circuit die 50B). In some embodiments, the first integrated circuit die 50A is a logic die, and the second integrated circuit die 50B is an interface die. The interface die bridges the logic die to memory dies, and translates commands between the logic die and the memory dies. In some embodiments, the first integrated circuit die 50A and the second integrated circuit die 50B are bonded such that the active surfaces are facing each other (e.g., are "face-to-face" bonded). Conductive vias 62 may be formed through one of the integrated circuit dies 50 so that external connections may be made to the die stack 60A. The conductive vias 62 may be through-substrate vias (TSVs), such as through-silicon vias or the like. In the embodiment shown, the conductive vias 62 are formed in the second integrated circuit die 50B (e.g., the interface die). The conductive vias 62 extend through the semiconductor substrate 52 of the respective integrated circuit die 50, to be physically and electrically connected to the metallization layer(s) of the interconnect structure 54.

As shown in FIG. 2B, the die stack 60B is a stacked device that includes multiple semiconductor substrates 52. For example, the die stack 60B may be a memory device that includes multiple memory dies such as a hybrid memory cube (HMC) device, a high bandwidth memory (HBM) device, or the like. Each of the semiconductor substrates 52 may (or may not) have a separate interconnect structure 54. The semiconductor substrates 52 are connected by conductive vias 62, such as TSVs.

FIGS. 3-14 are views of intermediate stages in the manufacturing of an integrated circuit package 200, in accordance with some embodiments. FIGS. 3, 4, 6, 7, 8, 9, 10, 11, 12, and 13 are cross-sectional views. FIGS. 5A, 5B, 5C, and 14 are top-down views, where some features are omitted for illustration clarity. A package component 100 is formed by bonding integrated circuit devices 120 to a wafer 110. The wafer 110 has a package region 110A, which includes a device, such as an interposer 140. The package region 110A will be singulated in subsequent processing to form the package component 100, which includes a singulated portion of the wafer 110 (e.g., an interposer 140) and the integrated circuit devices 120 which are bonded to that singulated portion of the wafer 110. In an embodiment, the package component 100 is a chip-on-wafer (CoW) component, although it should be appreciated that embodiments may be applied to other three-dimensional integrated circuit (3DIC) packages. The package component 100 is then mounted to a package substrate 210. Additionally, a package stiffener 230 is attached to the package substrate 210, around and on the package component 100. In an embodiment, the resulting integrated circuit package 200 is a chip-on-waferon-substrate (CoWoS®) package, although it should be appreciated that embodiments may be applied to other 3DIC packages.

Processing of one package region 110A of the wafer 110 is illustrated. It should be appreciated that any number of package regions 110A of a wafer 110 can be simultaneously processed and singulated to form multiple package components 100 from the singulated portions of the wafer 110.

Figure 3:
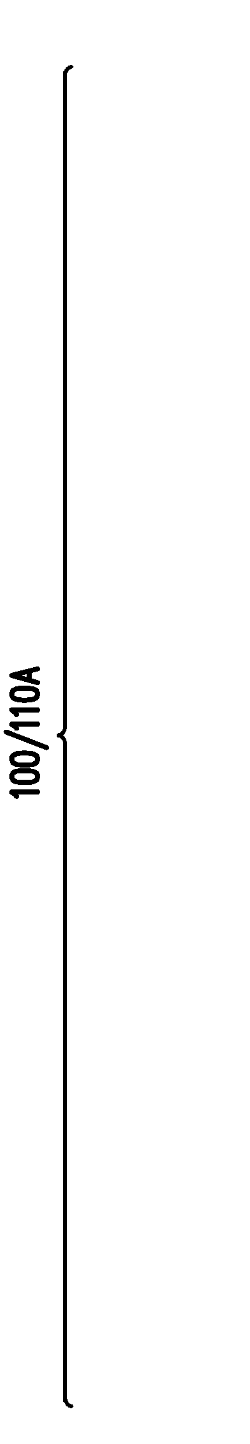
FIGS. 3-14 are views of intermediate stages in the manufacturing of an integrated circuit package, in accordance with some embodiments.
Figure 3:
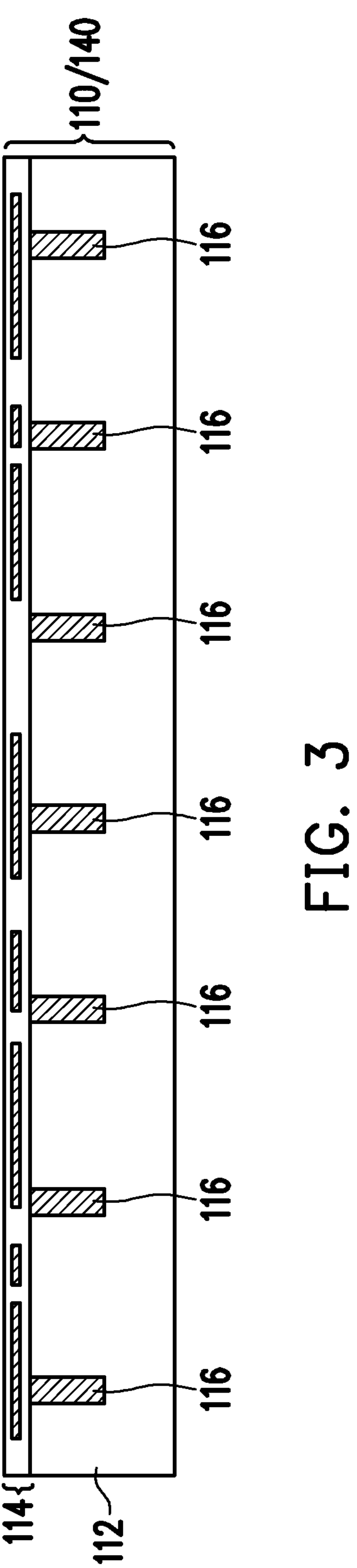

In FIG. 3, a wafer 110 is obtained or formed. The wafer 110 comprises devices in the package region 110A, which will be singulated in subsequent processing to be included in the package component 100. The devices in the wafer 110 may be interposers, integrated circuits dies, or the like. In some embodiments, interposers 140 are formed in the wafer 110, where the interposers 140 include a substrate 112, an interconnect structure 114, and conductive vias 116.

The substrate 112 may be a bulk semiconductor substrate, a semiconductor-on-insulator (SOI) substrate, a multi-layered semiconductor substrate, or the like. The substrate 112 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 112 may be doped or undoped. In embodiments where interposers are formed in the wafer 110, the substrate 112 generally does not include active devices therein, although the interposers may include passive devices formed in and/or on a front surface (e.g., the surface facing upward in FIG. 3) of the substrate 112. In embodiments where integrated circuits devices are formed in the wafer 110, active devices such as transistors, capacitors, resistors, diodes, and the like, may be formed in and/or on the front surface of the substrate 112.

The interconnect structure 114 is over the front surface of the substrate 112, and is used to electrically connect the devices (if any) of the substrate 112. The interconnect structure 114 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The metallization layer(s) of the interconnect structure 114 may be formed by a damascene process, such as a single damascene process, a dual damascene process, or the like.

In some embodiments, die connectors and a dielectric layer (not separately illustrated) are at the front side of the wafer 110. Specifically, the wafer 110 may include die connectors and a dielectric layer that are similar to those of the integrated circuit die 50 described for FIG. 1. For example, the die connectors and the dielectric layer may be part of an upper metallization layer of the interconnect structure 114.

The conductive vias 116 extend into the interconnect structure 114 and/or the substrate 112. The conductive vias 116 are electrically connected to metallization layer(s) of the interconnect structure 114. The conductive vias 116 may be TSVs. As an example to form the conductive vias 116, recesses can be formed in the interconnect structure 114 and/or the substrate 112 by, for example, etching, milling, laser techniques, a combination thereof, or the like. A thin barrier layer may be conformally deposited in the openings, such as by CVD, atomic layer deposition (ALD), physical vapor deposition (PVD), thermal oxidation, a combination thereof, or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, or the like. Examples of conductive materials are copper, tungsten, aluminum, silver, gold, a combination thereof, or the like. Excess conductive material and barrier layer is removed from a surface of the interconnect structure 114 or the substrate 112 by, for example, a CMP. Remaining portions of the barrier layer and conductive material form the conductive vias 116.

Figure 4:
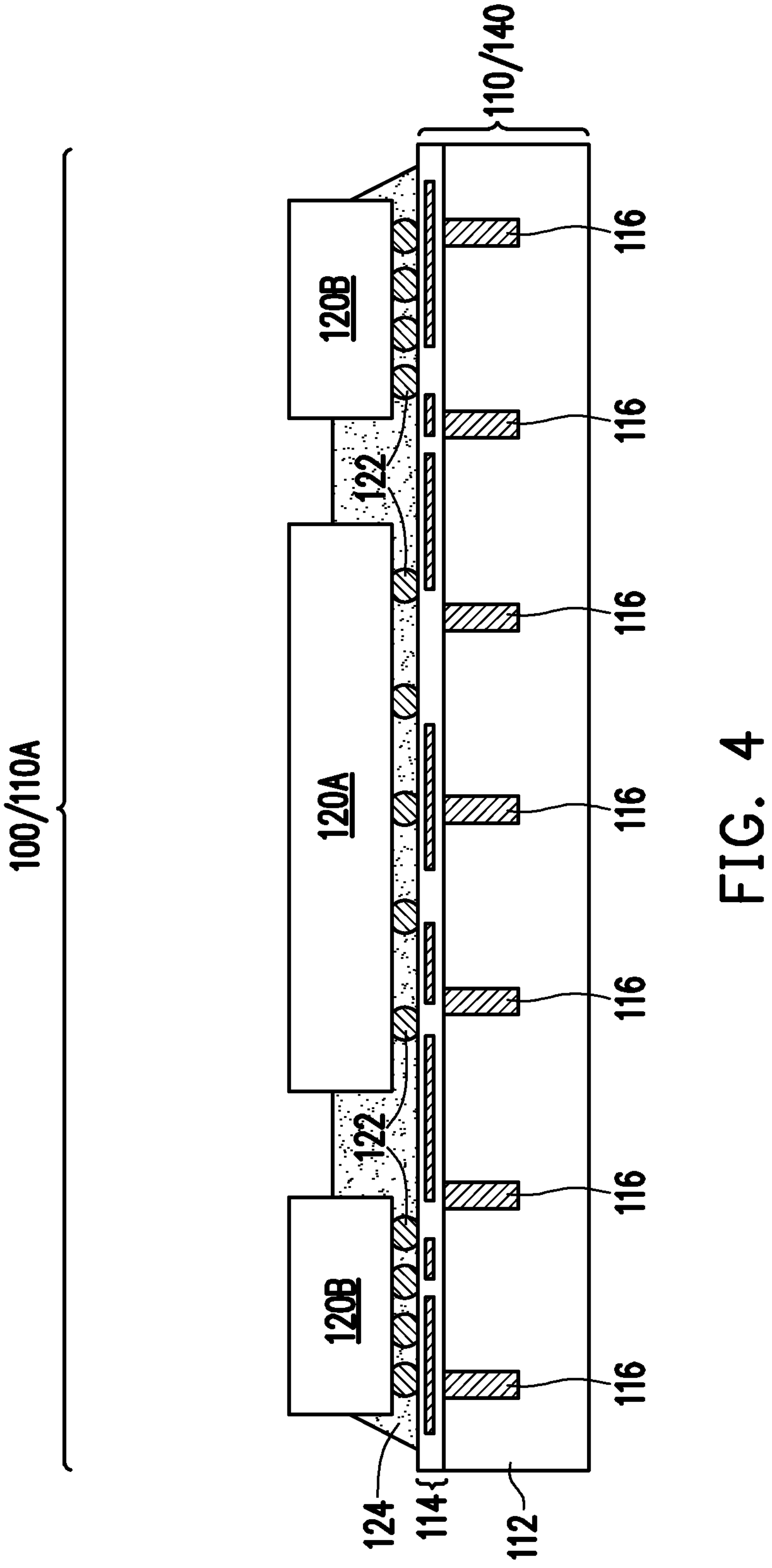

In FIG. 4, integrated circuit devices 120 are attached to the front side of the wafer 110. Multiple integrated circuit devices 120 are placed adjacent one another in the package region 110A. The integrated circuit devices 120 include one or more logic device(s) 120A and a plurality of memory devices 120B. The logic device(s) 120A and the memory devices 120B may be formed in processes of a same technology node, or may be formed in processes of different technology nodes. For example, the logic device(s) 120A may be formed by a more advanced process node than the memory devices 120B.

In the illustrated embodiment, the integrated circuit devices 120 are attached to the wafer 110 with solder bonds, such as with conductive connectors 122. The integrated circuit devices 120 may be placed on the interconnect structure 114 using, e.g., a pick-and-place tool. The conductive connectors 122 may be formed of a conductive material that is reflow able, such as solder, copper, aluminum, gold, nickel, silver, palladium, tin, the like, or a combination thereof. In some embodiments, the conductive connectors 122 are formed by initially forming a layer of solder through methods such as evaporation, electroplating, printing, solder transfer, ball placement, or the like. Once a layer of solder has been formed on the structure, a reflow may be performed in order to shape the conductive connectors 122 into desired bump shapes. Attaching the integrated circuit devices 120 to the wafer 110 may include placing the integrated circuit devices 120 on the wafer 110 and reflowing the conductive connectors 122. The conductive connectors 122 form joints between corresponding die connectors of the wafer 110 and the integrated circuit devices 120, electrically connecting the interposer 140 to the integrated circuit devices 120.

An underfill 124 may be formed around the conductive connectors 122, and between the wafer 110 and the integrated circuit devices 120. The underfill 124 may reduce stress and protect the joints resulting from the reflowing of the conductive connectors 122. The underfill 124 may be formed of an underfill material such as a molding compound, epoxy, or the like. The underfill 124 may be formed by a capillary flow process after the integrated circuit devices 120 are attached to the wafer 110, or may be formed by a suitable deposition method before the integrated circuit devices 120 are attached to the wafer 110. The underfill 124 may be applied in liquid or semi-liquid form and then subsequently cured.

In other embodiments (not separately illustrated), the integrated circuit devices 120 are attached to the wafer 110 with direct bonds. For example, fusion bonding, dielectric bonding, metal bonding, combinations thereof (e.g., a combination of dielectric-to-dielectric bonding and metal-to-metal bonding), or the like may be used to directly bond corresponding dielectric layers and/or die connectors of the wafer 110 and the integrated circuit devices 120 without the use of adhesive or solder. The underfill 124 may be omitted when direct bonding is used. Further, a mix of bonding techniques could be used, e.g., some integrated circuit devices 120 could be attached to the wafer 110 by solder bonds, and other integrated circuit devices 120 could be attached to the wafer 110 by direct bonds.

Each of the logic device(s) 120A may be a central processing unit (CPU), graphics processing unit (GPU), system-on-a-chip (SoC), microcontroller, or the like. Each of the logic device(s) 120A may be an integrated circuit die (similar to the integrated circuit die 50 described for FIG. 1), or may be a die stack (similar to the die stack 60A described for FIG. 2A). In this embodiment, the logic device(s) 120A are integrated circuit dies, such as system-on-chip (SoC) dies. In other embodiments (not separately illustrated), the logic device(s) 120A are die stacks, such as a SoIC devices.

Each of the memory devices 120B may be a dynamic random access memory (DRAM) die, static random access memory (SRAM) die, hybrid memory cube (HMC) module, a high bandwidth memory (HBM) module, or the like. Each of the memory devices 120B may be an integrated circuit die (similar to the integrated circuit die 50 described for FIG. 1), or may be a die stack (similar to the die stack 60B described for FIG. 2B). In this embodiment, the memory devices 120B are die stacks, such as high bandwidth memory (HBM) devices.

Figure 5A:
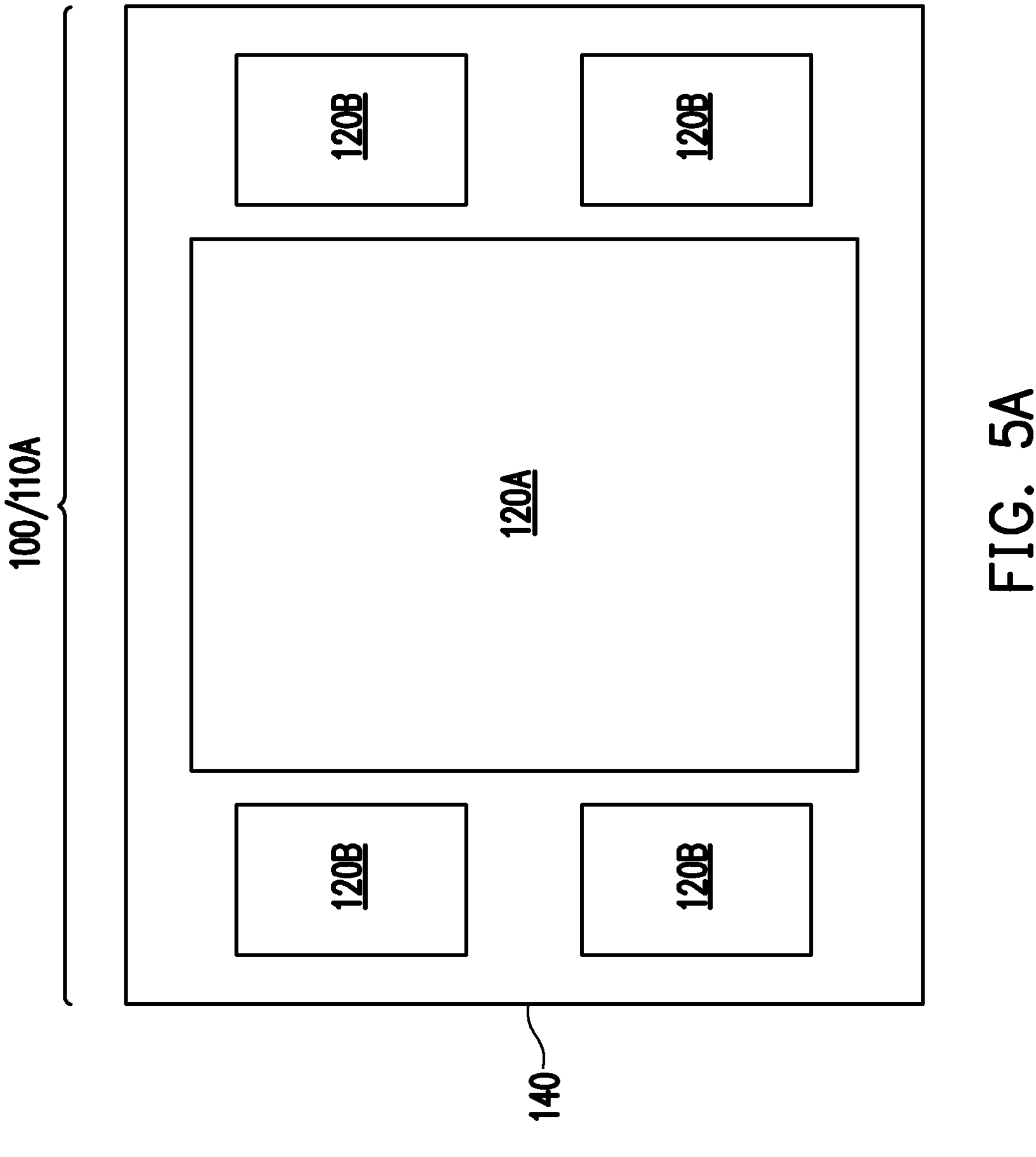
Figure 5B:
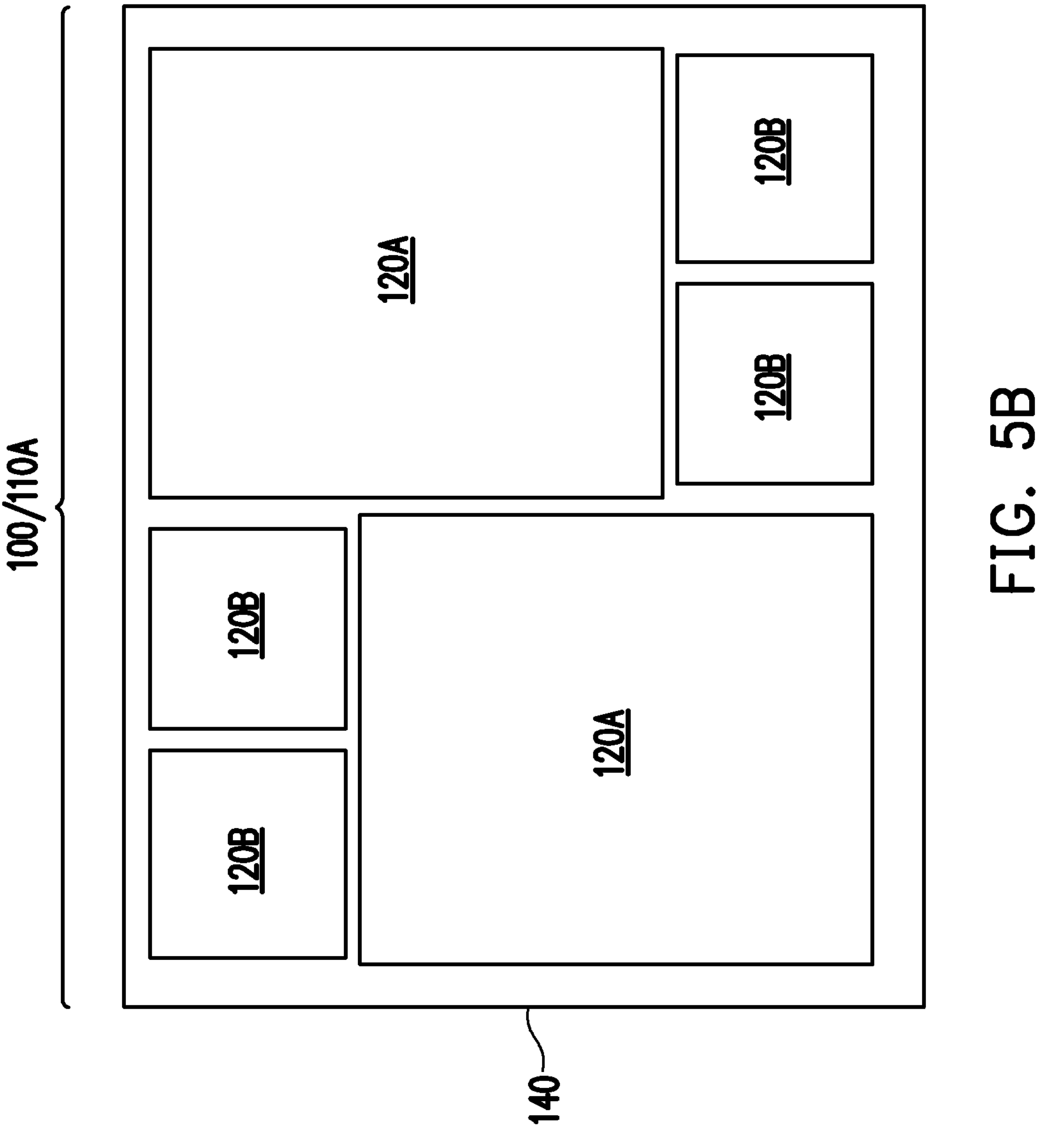
Figure 5C:
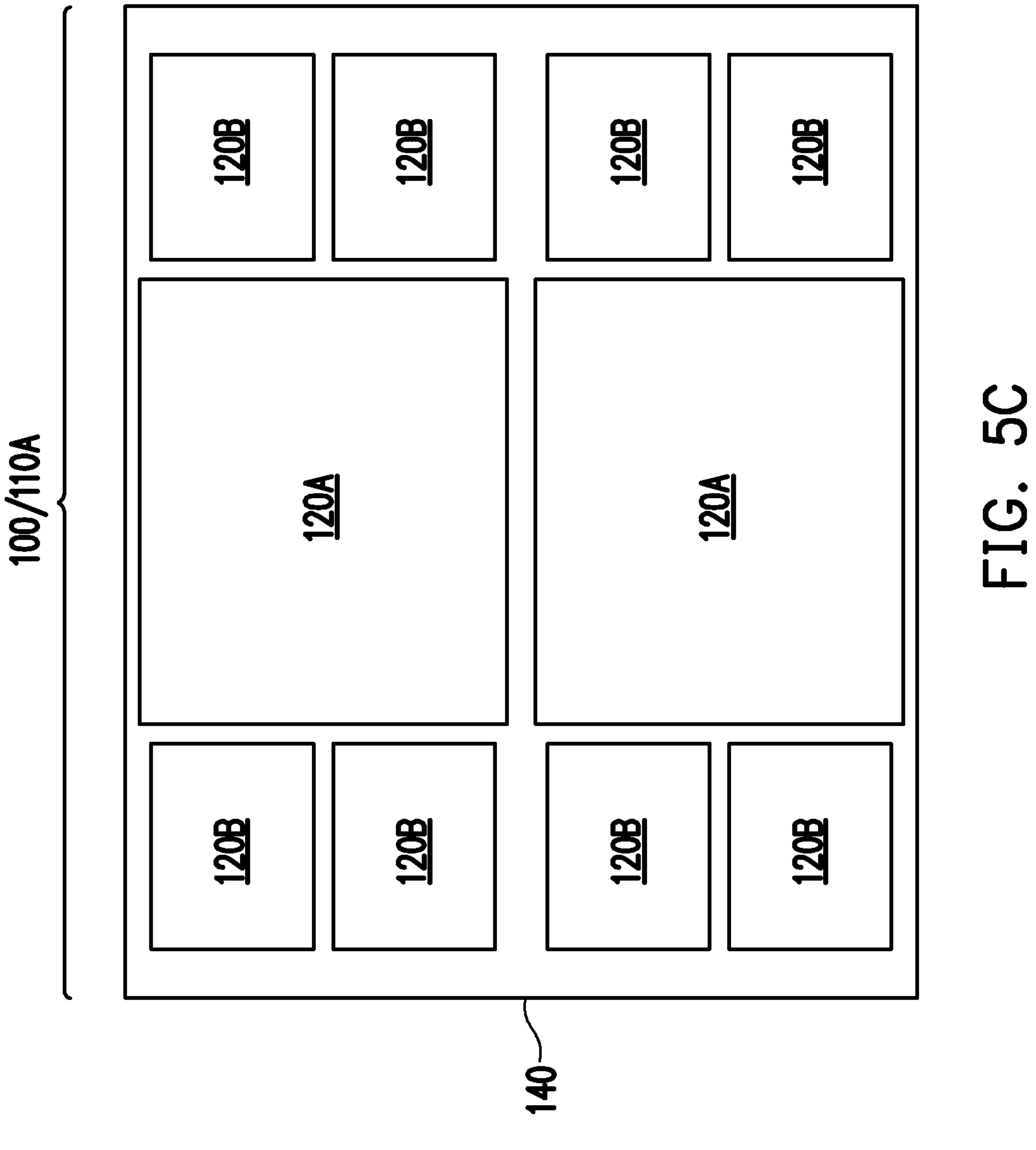

A desired type and quantity of integrated circuit devices 120 are attached in the package region 110A, and have a desired layout in a top-down view. In some embodiments, as shown in FIG. 5A, the integrated circuit devices 120 include a logic device 120A and a plurality of memory devices 120B, where the logic device 120A and the memory devices 120B are symmetrically laid out in the top-down view. In some embodiments, as shown in FIG. 5B, the integrated circuit devices 120 include a plurality of logic devices 120A and a plurality of memory devices 120B, where the logic devices 120A and the memory devices 120B are asymmetrically laid out in the top-down view. In some embodiments, as shown in FIG. 5C, the integrated circuit devices 120 include a plurality of logic devices 120A and a plurality of memory devices 120B, where the logic devices 120A and the memory devices 120B are symmetrically laid out in the top-down view. A symmetric layout is a layout where the memory devices 120B have at least one axis of symmetry around the logic device(s) 120A. The logic device(s) 120A may be disposed between the memory devices 120B in the top-down view. An asymmetric layout is a layout where the memory devices 120B have no axes of symmetry around the logic device(s) 120A. FIG. 4 and the subsequent views are shown with respect to the layout of FIG. 5A, but it should be appreciated that embodiments may be equally applicable to the layouts of FIGS. 5B and 5C.

Figure 6:
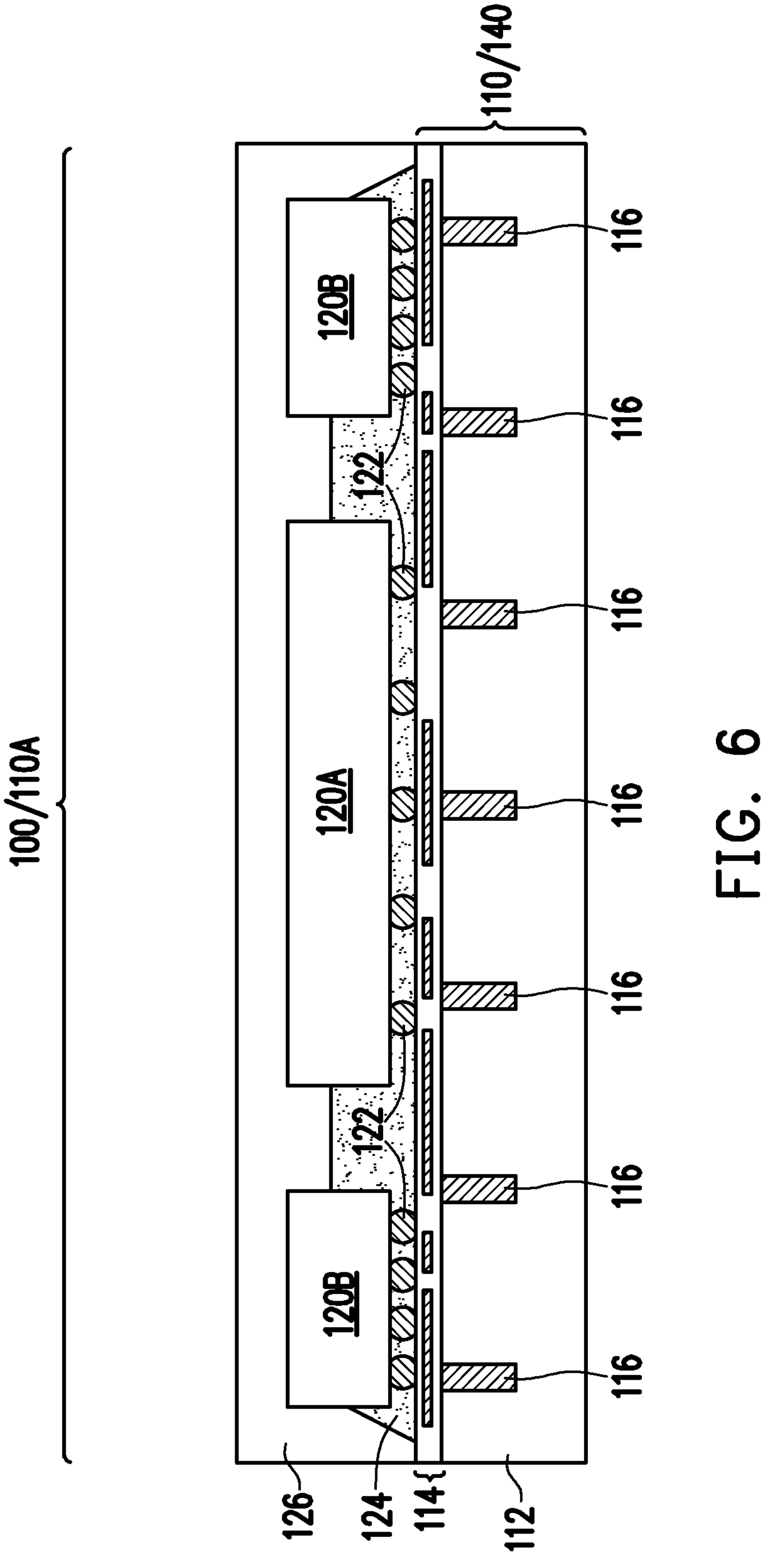

In FIG. 6, an encapsulant 126 is formed on and around the various components. After formation, the encapsulant 126 encapsulates the underfill 124 (if present) and the integrated circuit devices 120. The encapsulant 126 may be a molding compound, epoxy, or the like. The encapsulant 126 may be applied by compression molding, transfer molding, or the like, and is formed over the wafer 110 such that the integrated circuit devices 120 are buried or covered. The encapsulant 126 is further formed in gap regions between the integrated circuit devices 120. The encapsulant 126 may be applied in liquid or semi-liquid form and then subsequently cured.

Figure 7:
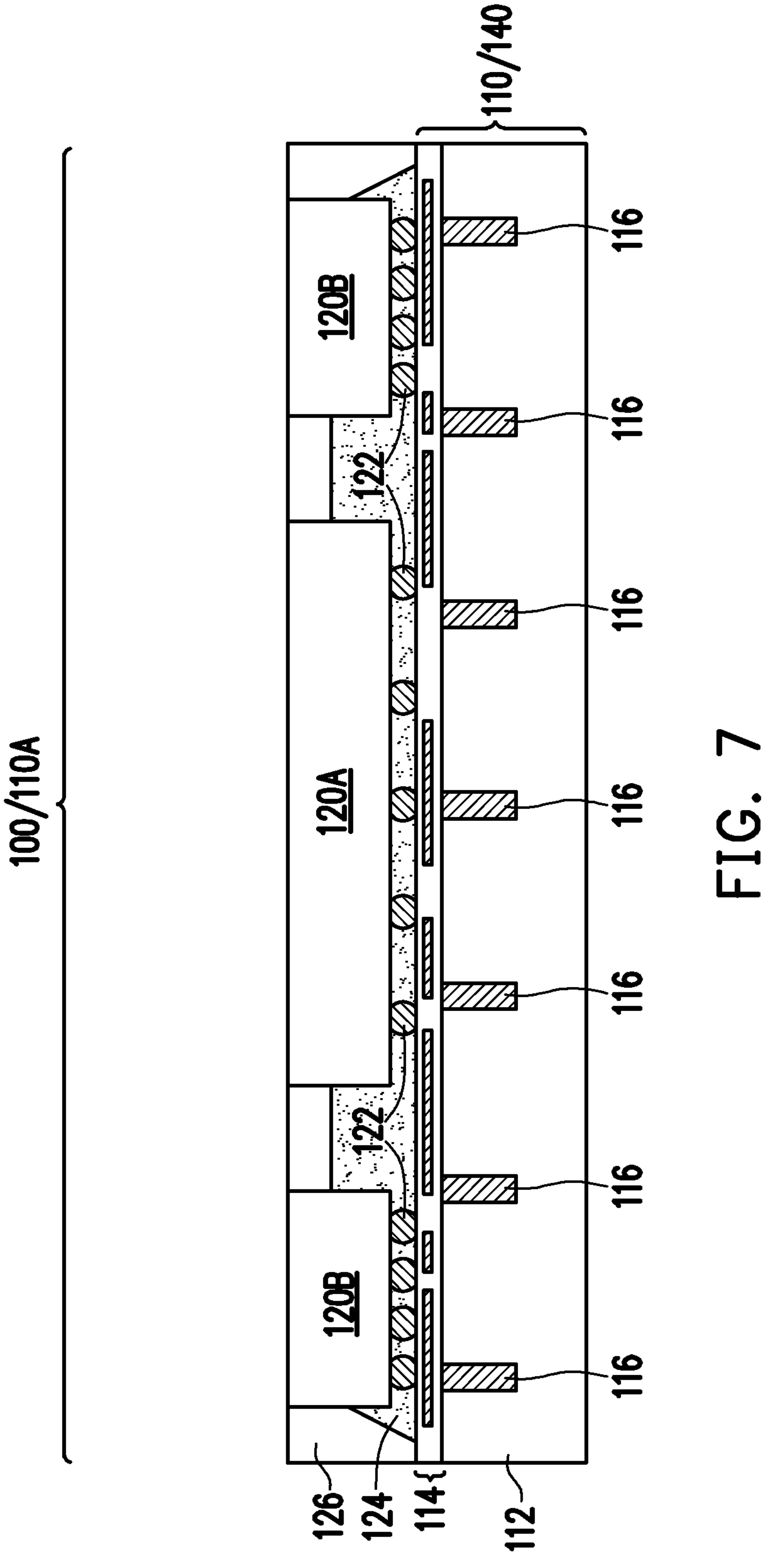

In FIG. 7, the encapsulant 126 is thinned to expose the integrated circuit devices 120. The thinning process may be a grinding process, a chemical-mechanical polish (CMP), an etch-back, combinations thereof, or the like. After the thinning process, the top surfaces of the integrated circuit devices 120 and the encapsulant 126 are substantially coplanar (within process variations). The thinning is performed until a desired amount of the integrated circuit devices 120 and the encapsulant 126 has been removed.

Figure 8:
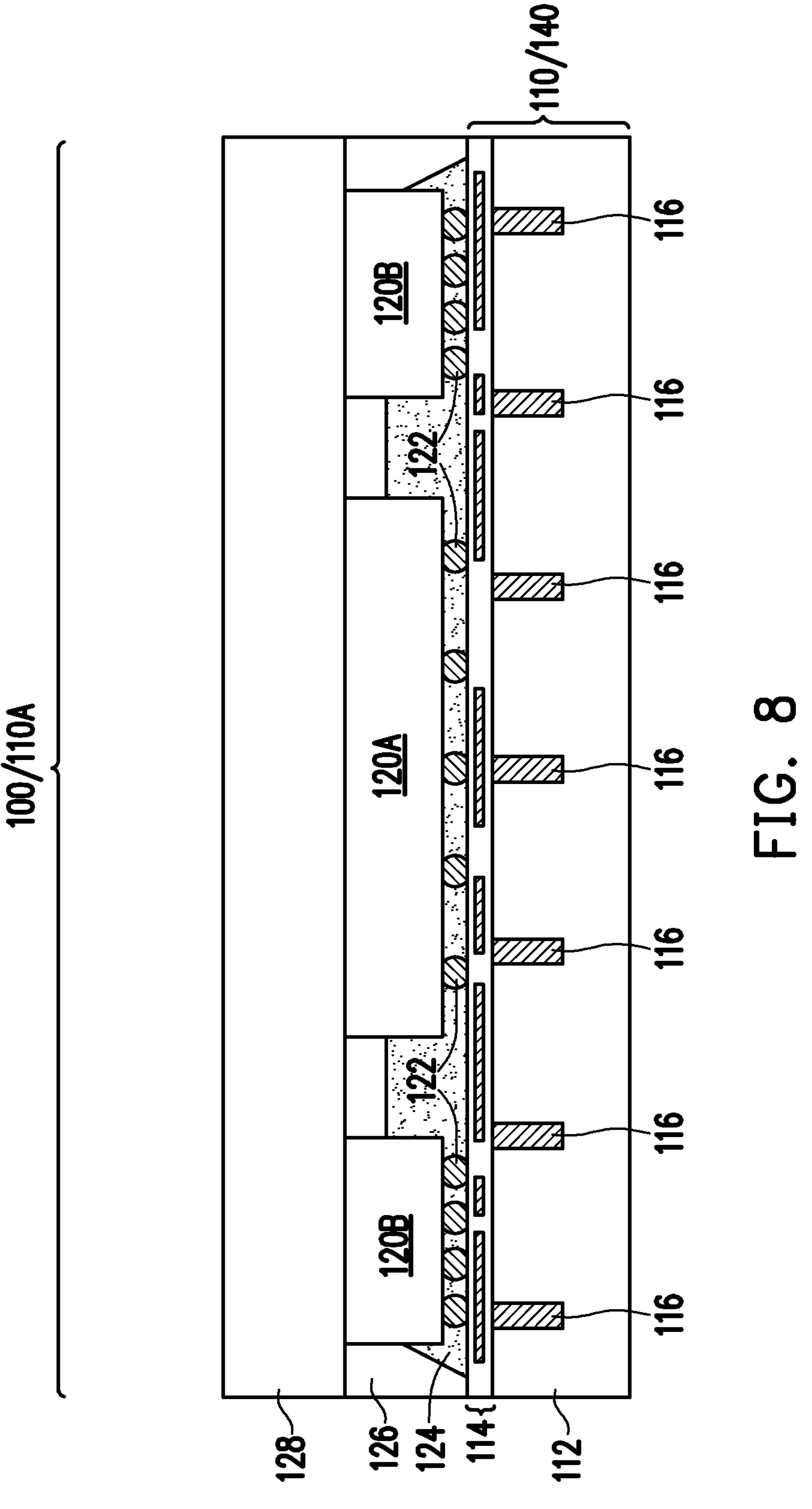

In FIG. 8, the intermediate structure is flipped over (not separately illustrated) to prepare for processing of the back side of the wafer 110. The intermediate structure may be placed on a carrier substrate 128 or other suitable support structure for subsequent processing. For example, the carrier substrate 128 may be attached to the integrated circuit devices 120 and/or the encapsulant 126. The carrier substrate 128 may be attached to the integrated circuit devices 120 and/or the encapsulant 126 by a release layer. The release layer may be formed of a polymer-based material, which may be removed along with the carrier substrate 128 from the structure after processing. In some embodiments, the carrier substrate 128 is a substrate such as a bulk semiconductor or a glass substrate. In some embodiments, the release layer is an epoxy-based thermal-release material, which loses its adhesive property when heated, such as a light-to-heat-conversion (LTHC) release coating.

Figure 9:
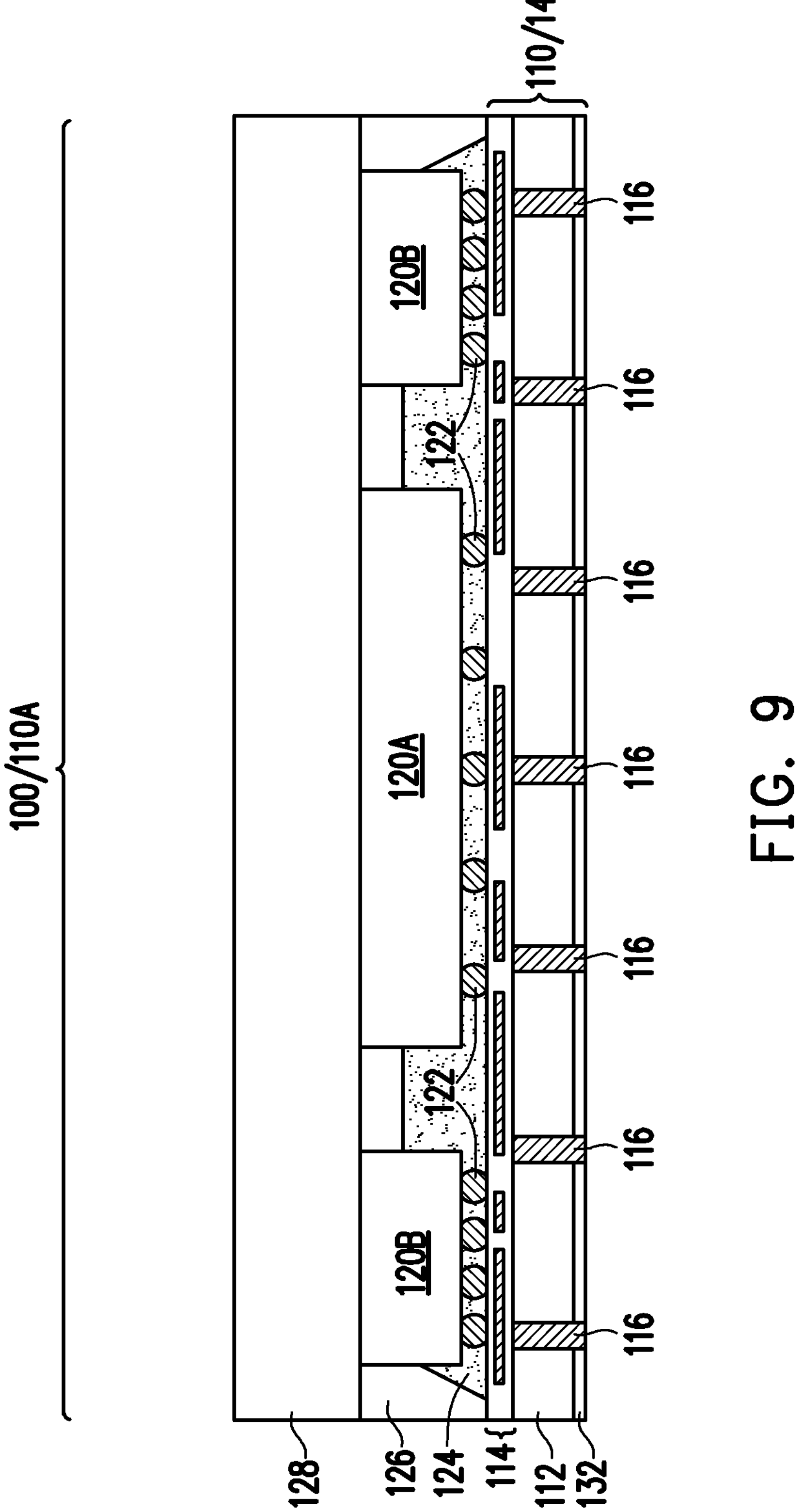

In FIG. 9, the substrate 112 is thinned to expose the conductive vias 116. Exposure of the conductive vias 116 may be accomplished by a thinning process, such as a grinding process, a chemical-mechanical polish (CMP), an etch-back, combinations thereof, or the like. In the illustrated embodiment, a recessing process is performed to recess the back surface of the substrate 112 such that the conductive vias 116 protrude at the back side of the wafer 110. The recessing process may be, e.g., a suitable etch-back process, chemical-mechanical polish (CMP), or the like. In some embodiments, the thinning process for exposing the conductive vias 116 includes a CMP, and the conductive vias 116 protrude at the back side of the wafer 110 as a result of dishing that occurs during the CMP. An insulating layer 132 is optionally formed on the back surface of the substrate 112, surrounding the protruding portions of the conductive vias 116. In some embodiments, the insulating layer 132 is formed of a silicon-containing dielectric material, such as silicon nitride, silicon oxide, silicon oxynitride, or the like, which may be formed by a suitable deposition method such as CVD or the like. Initially, the insulating layer 132 may bury the conductive vias 116. A removal process can be applied to the various layers to remove excess materials over the conductive vias 116. The removal process may be a planarization process such as a chemical mechanical polish (CMP), an etch-back, combinations thereof, or the like. After planarization, the exposed surfaces of the conductive vias 116 and the insulating layer 132 are substantially coplanar (within process variations) and are exposed at the back side of the wafer 110. In another embodiment, the insulating layer 132 is omitted, and the exposed surfaces of the substrate 112 and the conductive vias 116 are substantially coplanar (within process variations).

Figure 10:
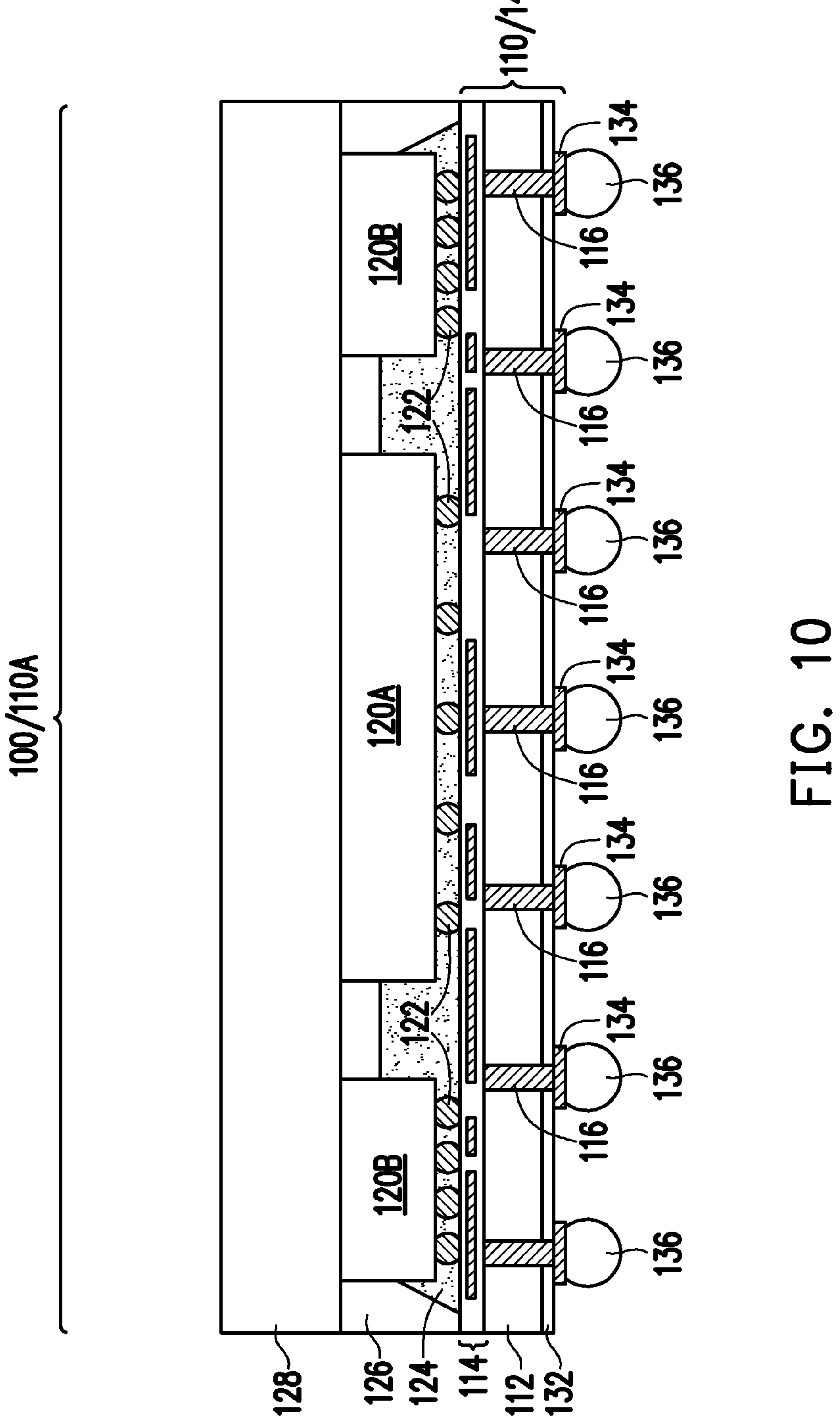

In FIG. 10, under bump metallurgies (UBMs) 134 are formed on the exposed surfaces of the conductive vias 116 and the insulating layer 132 (or the substrate 112, when the insulating layer 132 is omitted). As an example to form the UBMs 134, a seed layer (not separately illustrated) is formed over the exposed surfaces of the conductive vias 116 and the insulating layer 132 (if present) or the substrate 112. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 134. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 134.

Further, conductive connectors 136 are formed on the UBMs 134. The conductive connectors 136 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 136 may be formed of a conductive material that is reflowable, such as solder, copper, aluminum, gold, nickel, silver, palladium, tin, the like, or a combination thereof. In some embodiments, the conductive connectors 136 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 136 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof, which may be formed by a plating process.

Figure 11:
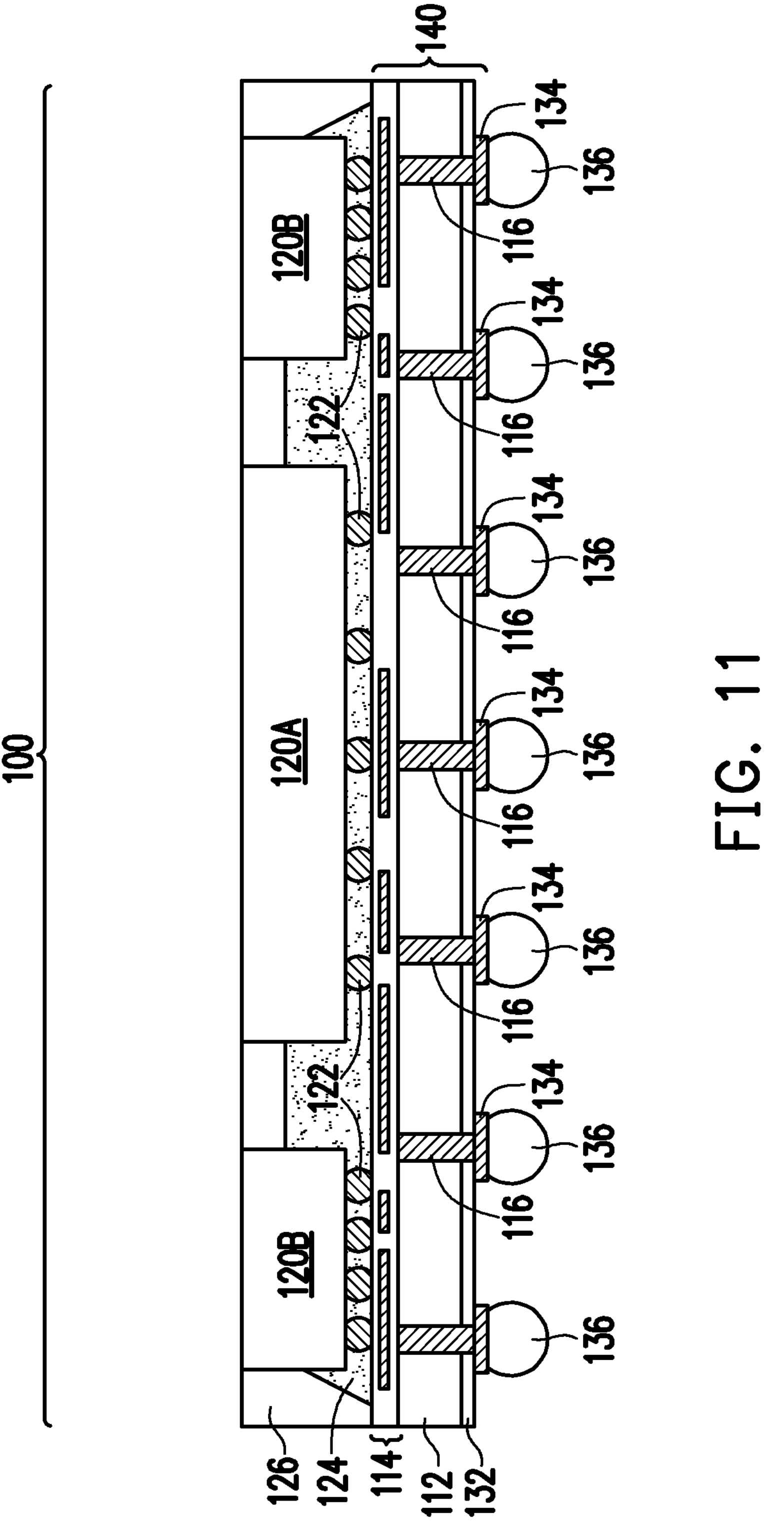

In FIG. 11, a carrier debonding is performed to detach (debond) the carrier substrate 128 from the integrated circuit devices 120 and/or the encapsulant 126. In embodiments where the carrier substrate 128 is attached to the integrated circuit devices 120 and/or the encapsulant 126 by a release layer, the debonding includes projecting a light such as a laser light or an ultraviolet (UV) light on the release layer so that the release layer decomposes under the heat of the light and the carrier substrate 128 can be removed. The structure is then flipped over and placed on a tape (not separately illustrated).

Further, a singulation process is performed by cutting along scribe line regions, e.g., around the package region 110A. The singulation process may include sawing, dicing, or the like. For example, the singulation process can include sawing the insulating layer 132, the encapsulant 126, the interconnect structure 114, and the substrate 112. The singulation process singulates the package region 110A from adjacent package regions. The resulting, singulated package component 100 is from the package region 110A. The singulation process forms interposers 140 from the singulated portions of the wafer 110. The interposers 140 also include portions of the insulating layer 132 and the UBMs 134. As a result of the singulation process, the outer sidewalls of the interposer 140 and the encapsulant 126 are laterally coterminous (within process variations).

Figure 12:
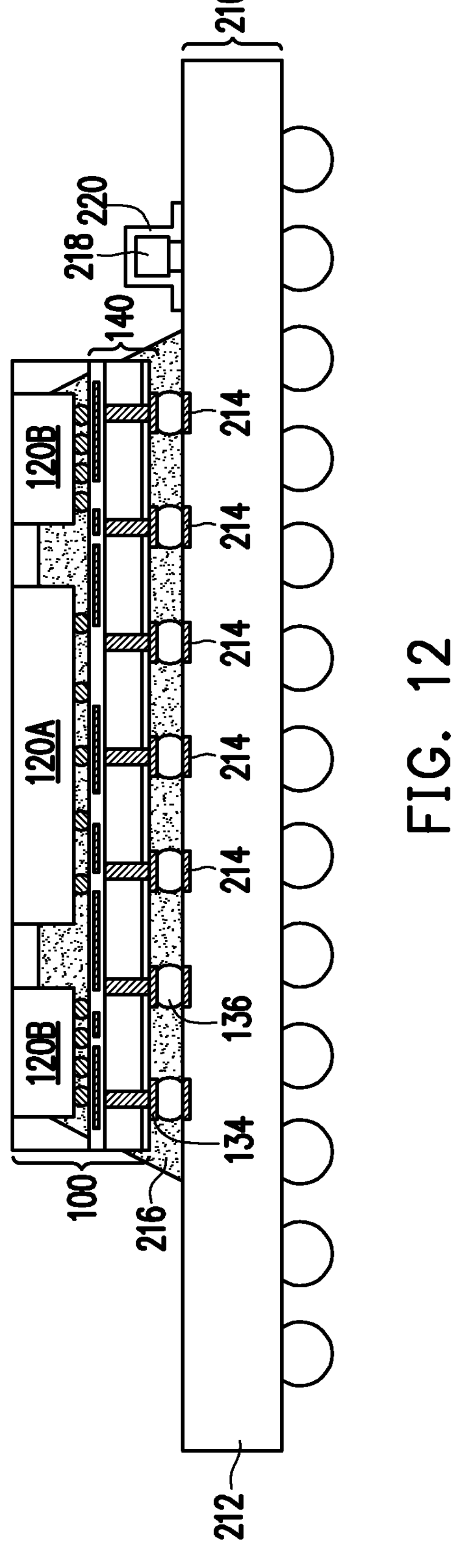

In FIG. 12, the package component 100 is attached to a package substrate 210. The package substrate 210 includes a substrate core 212, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 212 may be a SOI substrate. Generally, an SOI substrate includes a layer of a semiconductor material such as epitaxial silicon, germanium, silicon germanium, SOI, SGOI, or combinations thereof. The substrate core 212 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate core 212.

The substrate core 212 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 212 may also include metallization layers and vias (not separately illustrated) and bond pads 214 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper), with vias interconnecting the layers of conductive material, and may be formed through any suitable process (such as deposition, damascene, dual damascene, or the like). In some embodiments, the substrate core 212 is substantially free of active and passive devices.

Attaching the package component 100 to the package substrate 210 may include placing the package component 100 on the package substrate 210 and reflowing the conductive connectors 136. The conductive connectors 136 are reflowed to attach the UBMs 134 to the bond pads 214. The conductive connectors 136 connect the package component 100, including metallization layers of the interposer 140, to the package substrate 210, including metallization layers in the substrate core 212. Thus, the package substrate 210 is electrically connected to the integrated circuit devices 120.

In some embodiments, passive devices (e.g., surface mount devices (SMDs), not separately illustrated) are attached to the package component 100 (e.g., to the UBMs 134) prior to mounting on the package substrate 210. In such embodiments, the passive devices may be attached to a same surface of the package component 100 as the conductive connectors 136.

In some embodiments, an underfill 216 is formed between the package component 100 and the package substrate 210, surrounding the conductive connectors 136 and the UBMs 134. The underfill 216 may be formed by a capillary flow process after the package component 100 is attached or may be formed by a suitable deposition method before the package component 100 is attached. The underfill 216 may be a continuous material extending from the package substrate 210 to the interposer 140.

Additionally, passive devices 218 are attached to the package substrate 210. The passive devices 218 are attached to the same surface of the package substrate 210 as the conductive connectors 136. The passive devices 218 may be attached to the package substrate 210 prior to or after attaching the package component 100 to the package substrate 210. The passive devices 218 may include capacitors, resistors, inductors, the like, or a combination thereof. The passive devices 218 may be surface mount devices (SMDs), 2-terminal integrated passive devices (IPDs), multi-terminal IPDs, or the like.

Optionally, protective layers 220 are formed on and around the passive devices 218. Each protective layer 220 is over a respective passive device 218. The protective layers 220 seal the interfaces of the passive devices 218 with the package substrate 210, so that a subsequently formed thermal interface material does not short the passive devices 218. The protective layers 220 may be formed by forming an insulating material and patterning the insulating material. The insulation material may be a parylene based coating that has high electrical resistively and/or resists moisture penetration. The insulating material may be a silicone-based insulating material such as a silicone glue, silicone adhesive, silicone elastomer, silicone rubber or the like; a polymer material such as polybenzoxazole (PBO), polyimide, a benzocyclobuten (BCB) based polymer, or the like; a laminate material such as Ajinomoto build-up film (ABF) or the like; combinations thereof; or the like. The insulating material may be formed, for example, by deposition, spin coating, lamination, or the like.

Figure 13:
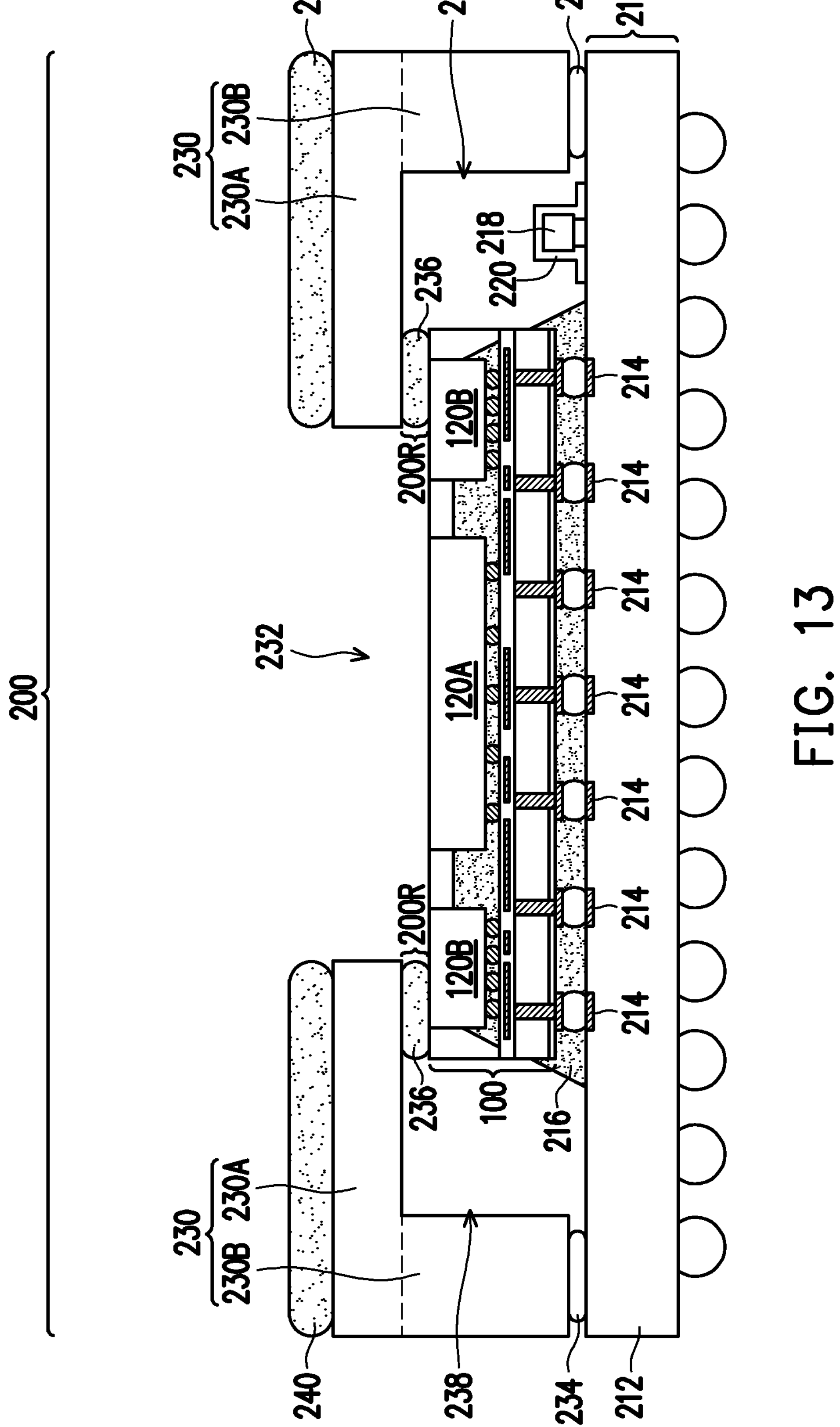

In FIG. 13, a package stiffener 230 is attached to the package substrate 210 and to the package component 100. The package stiffener 230 is a stiffener ring that helps reduce warpage of the package substrate 210 and the package component 100. The package stiffener 230 is formed of a rigid material such as copper, aluminum, cobalt, nickel-coated copper, stainless steel, tungsten, a copper-tungsten alloy, a copper-molybdenum alloy, silver diamond, copper diamond, metal diamond composites, aluminum nitride, aluminum silicon carbide, an iron-nickel alloy (e.g., Alloy42), the like, or combinations thereof. In some embodiments, the package stiffener 230 includes a main body formed of a first metal, and the main body is partially or completely coated with a second metal, such as gold, nickel, a titanium-gold alloy, lead, tin, a nickel-vanadium alloy, or the like. In some embodiments, the package stiffener 230 is formed of a super-conductive material such as silver diamond, diamond-like carbon, silver-diamond composite, copper-diamond composite, aluminum-diamond composite, Alloy42-diamond composite, carbon metal composite, the like, or a combination thereof. In some embodiments, the material of the package stiffener 230 has a Young's modulus in the range of $145\times10^3$ MPa to $200\times10^3$ MPa, and has a coefficient of thermal expansion in the range of 1.3 ppm/° C. to 17.8 ppm/° C.

The package stiffener 230 may be attached to the package substrate 210 with an adhesive 234. The adhesive 234 may be any suitable adhesive, epoxy, attach film, or the like. The adhesive 234 may be applied to the package stiffener 230 or may be applied to an upper surface of the package substrate 210.

In this embodiment, the package stiffener 230 includes an upper portion 230A and a lower portion 230B. The upper portion 230A is above and coupled to a periphery of the package component 100. The lower portion 230B is around the periphery of the package component 100 and coupled to the package substrate 210. The width of the upper portion 230A is greater than the width of the lower portion 230B. The height of the package stiffener 230 is greater than the height of the package component 100.

The package stiffener 230 is attached to the package component 100 with a lower dam 236. The lower dam 236 completely fills regions 200R where the package stiffener 230 overlaps with the package component 100, thereby sealing off an area between the package substrate 210 and the package stiffener 230 to create a void 238. The void 238 is around the package component 100 in the top-down view. The package stiffener 230 overlaps the passive device 218, and as a result, the passive devices 218 are in the void 238. By sealing the void 238 with the lower dam 236, a thermal interface material subsequently formed on the package component 100 may have a reduced risk of flowing to and shorting the passive devices 218, even when the thermal interface material is a liquid metal. In some embodiments, the lower dam 236 has a thickness in the range of 0.02 mm to 0.5 mm.

The lower dam 236 is formed of an elastic adhesive material. The lower dam 236 is an elastic dam. Acceptable elastic adhesive materials include graphite, a silicone-based adhesive, an epoxy-resin-based adhesive, and the like. Other acceptable elastic adhesive materials may be used, as subsequently described. The material of the lower dam 236 may be different from the material of the adhesive 234. In some embodiments, the lower dam 236 is formed of a rubber material that contains a curing promoter.

In some embodiments, the lower dam 236 is formed of a phase-change material (PCM) and a filler. The filler may be a metal such as aluminum. The phase-change material is capable of changing phases from a solid state to a soft state (e.g., a viscous liquid state) above a desired temperature. In some embodiments, the phase-change material changes from a solid to a viscous liquid at a temperature in the range of 40° C. to 60° C. More generally, the viscosity of the phase-change material decreases as temperature increases. A phase-change material may include long polymer chains that provide good thermal stability for the filler in both states. The phase-change material may be applied as a pad, or dispensed as an elastomer. In some embodiments, the phase-change material is a matrix comprising a polymer component, an amorphous polymer matrix, a silicone-organic block copolymer, a thermally conductive filler, a treating agent, and an antioxidant. In some embodiments, the phase-change material includes paraffin wax, alkyl hydrocarbons, or amorphous ethylene propylene rubber. In some embodiments, the phase-change material includes a tin-indium-bismuth alloy. Advantageously, a phase-change material may have good thermal dissipation, good gap-filling ability (which may help ensure the regions 200R are filled), good wettability, a low thermal resistance, a low Young's modulus (which may reduce the risk of cracking), and good ductility (which may reduce the risk of delamination). In some embodiments, the phase-change material has a viscosity in the range of 30 Pa s to 1000 Pa s, a specific gravity in the range of 2 to 5, a k-value in the range of 2 W/m-k to 100 W/m-k, a coefficient of thermal expansion in the range of 20 ppm/° C. to 80 ppm/° C., and a Young's modulus in the range of 20 kPa to 100 kPa.

The lower dam 236 may be preformed as a film or pad with a desired shape, which is applied to the package stiffener 230 or to the package component 100. The lower dam 236 is around the periphery of the package component 100, with the center of the package component 100 being free of the lower dam 236. The lower dam 236 partially or completely covers the memory devices 120B.

Additionally, an upper dam 240 may be formed on the package stiffener 230. The upper dam 240 will completely fills regions between the package stiffener 230 and a subsequently attached heat spreader, thereby sealing off an area between the subsequently attached heat spreader and the package component 100 to create a void. According, a thermal interface material subsequently formed on the package component 100 may have a reduced risk of leaking, even when the thermal interface material is a liquid metal. In some embodiments, the upper dam 240 has a thickness in the range of 0.05 mm to 0.5 mm. The thickness of the upper dam 240 may be different than the thickness of the lower dam 236. For example, the upper dam 240 may be thicker than the lower dam 236.

The upper dam 240 may be formed of any of the candidate materials of the lower dam 236. The material of the upper dam 240 may (or may not) be the same as the material of the lower dam 236. For example, the lower dam 236 and the upper dam 240 may both be formed of the same phase-change material. The upper dam 240 may be preformed as a film or pad with a desired shape, which is applied to the package stiffener 230. The upper dam 240 is an elastic dam.

Figure 14:
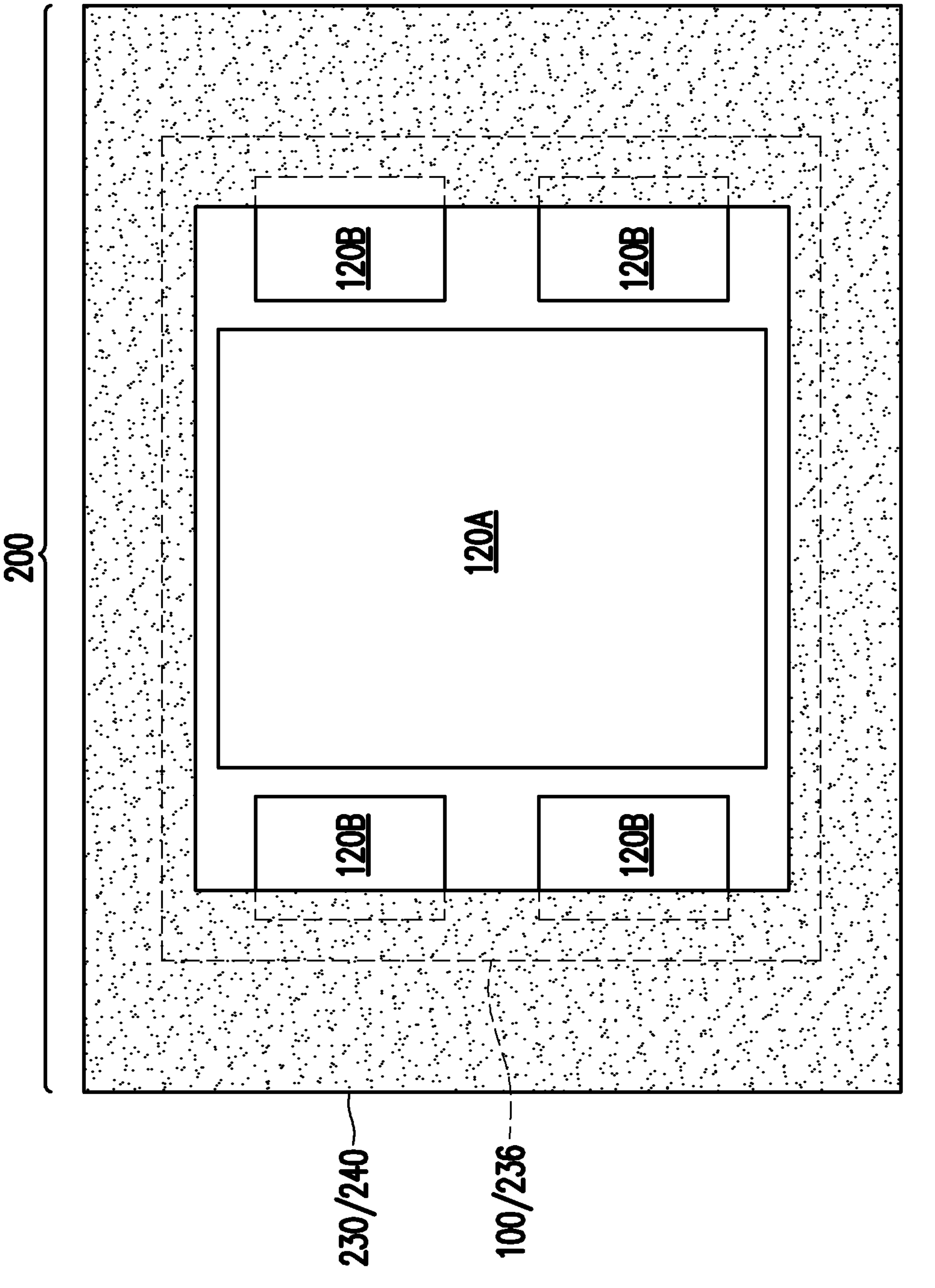

An opening 232 extends through the upper dam 240, the package stiffener 230, and the lower dam 236. Accordingly, the upper dam 240, the package stiffener 230, and the lower dam 236 are each rings, with the opening 232 extending through the middle of each ring. Thus, as shown in FIG. 14, the upper dam 240, the package stiffener 230, and the lower dam 236 each have a ring-shaped profile in the top-down view. The width of a ring-shaped element refers to the difference between the outer and inner diameter of the ring-shaped element. The upper dam 240 and the package stiffener 230 may have the same ring-shaped profile, while the lower dam 236 has a different ring-shaped profile than the upper dam 240 and the package stiffener 230. The package stiffener 230 may be a rectangular ring that is defined by straight horizontal and vertical portions of the package stiffener 230 in the top-down view. The opening 232 is disposed above the logic device(s) 120A in the top-down view and, in this embodiment, exposes the logic device(s) 120A. The width of the opening 232 is less than the width of the package component 100, and may be greater than the width of the logic device(s) 120A.

The logic device(s) 120A may have a large power density. For example, a CPU or GPU may have a power density of up to 4 W/mm$^2$, and a package component 100 having such logic device(s) 120A may have a total power consumption in the range of 400 watts to 600 watts. When the logic device(s) 120A have a large power density, thermal hot spots may form in the package component 100. The opening 232 exposes a portion of the package component 100, and specifically, at least partially exposes each of the logic device(s) 120A. In some embodiments where the integrated circuit devices 120 are symmetrically laid out, the opening 232 completely exposes each of the logic device(s) 120A. In some embodiments where the integrated circuit devices 120 are asymmetrically laid out, the opening 232 partially exposes each of the logic device(s) 120A. Each of the upper dam 240, the package stiffener 230, and the lower dam 236 at least partially overlap the memory devices 120B, such that the opening 232 does not completely expose the memory devices 120B. The opening 232 provides an area for a heat spreader to be subsequently disposed in, such that the heat spreader may be attached directly to the logic device(s) 120A. The heat spreader may thus be directly thermally coupled to the logic device(s) 120A (without the package stiffener 230 being in the thermal path between the heat spreader and the logic device(s) 120A), so as to help reduce the formation of hot spots in the package component 100.

Figure 15:
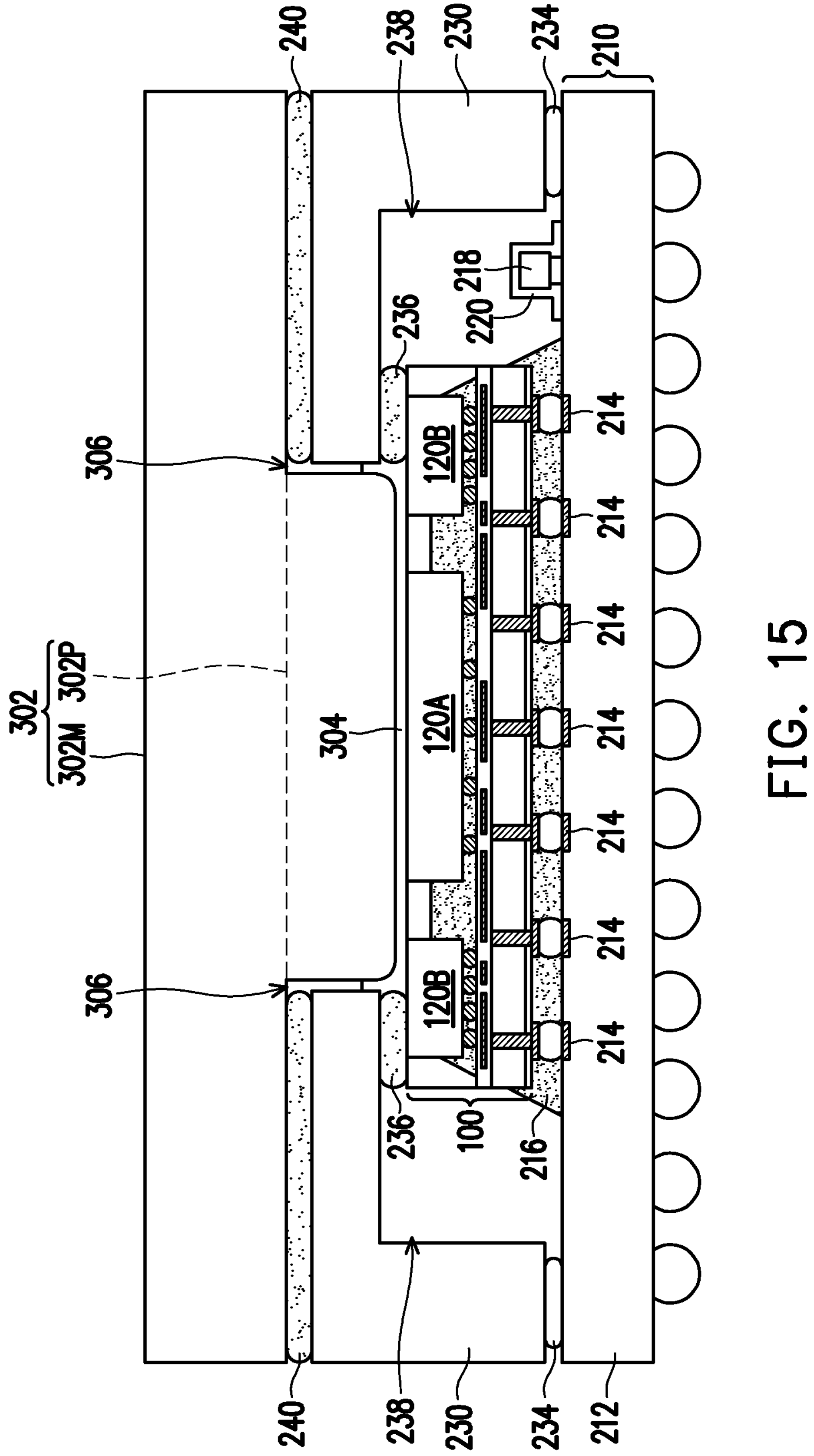
FIG. 15 is a cross-sectional view of a device implementing an integrated circuit package, in accordance with some embodiments.

FIG. 15 is a cross-sectional view of a device implementing the integrated circuit package 200 of FIGS. 13-14, in accordance with some embodiments. The device may be, e.g., a high-performance computing (HPC) system, an artificial intelligence (AI) accelerator, or the like.

A heat spreader 302 is attached to the integrated circuit package 200 (e.g., to the package stiffener 230 and to the package component 100). The heat spreader 302 may be a thermal lid, a heatsink, a water cooling block, or the like. The heat spreader 302 may be formed of a material with high thermal conductivity, such as a metal, such as copper, steel, iron, or the like. The heat spreader 302 may be metallized with a coating such as nickel and/or gold. The heat spreader 302 protects the package component 100 and forms a thermal pathway to conduct heat from the various components of the package component 100. The heat spreader 302 has a main portion 302M and a protruding portion 302P. The main portion 302M is disposed above the package stiffener 230, and is attached to the package stiffener 230 by the upper dam 240. The protruding portion 302P is inserted into the opening 232 (see FIG. 13), and is directly coupled to the logic device(s) 120A. As such, the protruding portion 302P extends through the upper dam 240, the package stiffener 230, and the lower dam 236. Advantageously, the package stiffener 230 is not in the thermal path between the heat spreader 302 and the logic device(s) 120A.

The heat spreader 302 is adhered to the package component 100 with a thermal interface material 304. The thermal interface material 304 has a high thermal conductivity. In some embodiments, the thermal interface material 304 is a polymer with thermally conductive fillers. Acceptable thermally conductive fillers may include aluminum oxide, boron nitride, aluminum nitride, aluminum, copper, silver, indium, a combination thereof, or the like. In some embodiments, the thermal interface material 304 is a film-based or sheet-based material such as a sheet with a synthesized carbon nanotube structure integrated into the sheet, a thermally conductive sheet with vertically oriented graphite fillers, or the like. In some embodiments, the thermal interface material 304 is a liquid metal, a metal pad, another metallic material, combinations thereof, or the like. Acceptable liquid metals may include solder, indium, copper, bismuth, tin, rhodium, palladium, platinum, silver, gold, gallium, combinations thereof, or the like, which are applied in film form or in liquid form. The thermal interface material 304 is different from the material(s) of the lower dam 236 and the upper dam 240. The thermal interface material 304 may be dispensed in the opening 232 (see FIG. 13) and on the package component 100 (e.g., on the back-side surface(s) of the logic device(s) 120A) and/or on the protruding portion 302P of the heat spreader 302. The heat spreader 302 may also be attached to the package component 100 by other techniques.

The heat spreader 302 is attached to the package stiffener 230 with the upper dam 240. The upper dam 240 completely fills regions where the heat spreader 302 overlaps with the package stiffener 230, thereby sealing off an area between the heat spreader 302 and the package component 100 to create a void 306. The void 306 is around the protruding portion 302P of the heat spreader 302 in the top-down view, and the thermal interface material 304 is in the void 306. The void 306 is the remaining and sealed portion of the opening 232 (see FIG. 13). By sealing the void 306 with the upper dam 240, a the thermal interface material 304 may have a reduced risk of flowing to and shorting the passive devices 218. The thermal interface material 304 in the void 306 may extend along a top surface of the package component 100, a bottom surface of the protruding portion 302P of the heat spreader 302, sidewalls of the lower dam 236, sidewalls of the package stiffener 230, and/or sidewalls of the protruding portion 302P of the heat spreader 302. The thermal interface material 304 in the void 306 may also extend along sidewalls of the upper dam 240.

Embodiments may achieve advantages. Utilizing the package stiffener 230 helps reduce warpage of the package substrate 210 and the package component 100. The opening 232 (see FIG. 13) in the package stiffener 230 allows the protruding portion 302P of the heat spreader 302 to be attached directly to the logic device(s) 120A. As previously noted, the logic device(s) 120A may have a large power density. Directly thermally coupling the heat spreader 302 to the logic device(s) 120A (without the package stiffener 230 being in the thermal path between the heat spreader 302 and the logic device(s) 120A) can improve thermal dissipation and help reduce the formation of hot spots in the package component 100. Further, attaching the heat spreader 302 directly to the logic device(s) 120A (instead of forming the package stiffener 230 over the logic device(s) 120A) allows thermal dissipation from the package component 100 to be less dependent on warpage, which is particularly advantageous when the package component 100 includes multiple large devices, such as multiple SoCs.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 16:
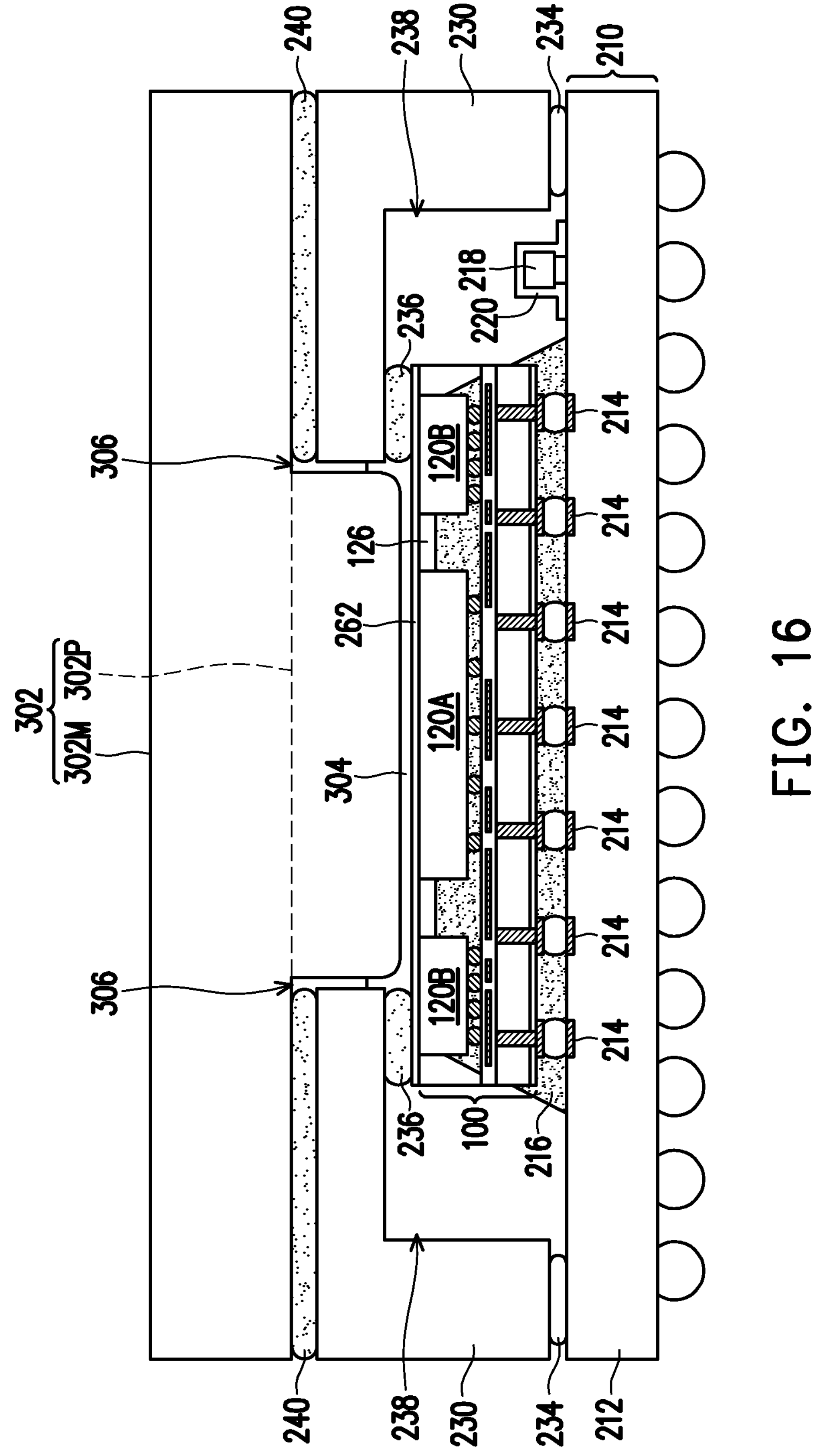
FIG. 16 is a cross-sectional view of a device implementing an integrated circuit package, in accordance with some embodiments.

FIG. 16 is a cross-sectional view of a device implementing an integrated circuit package 200, in accordance with some embodiments. This embodiment is similar to the embodiment of FIG. 15, except the package component 100 includes a dummy metallization 262 on the back-side surfaces of the integrated circuit devices 120. The dummy metallization 262 before or after the package component 100 is singulated. The lower dam 236 and the thermal interface material 304 are thus disposed on a surface of the dummy metallization 262, instead of directly on the back-side surfaces of the logic device(s) 120A. The dummy metallization 262 provides a surface with good wetting ability for the thermal interface material 304. When the dummy metallization 262 is formed, the opening 232 (see FIG. 13) exposes the dummy metallization 262 instead of the logic device(s) 120A.

The dummy metallization 262 may be formed of a conductive material such as copper, titanium, nickel, gold, the like, or combinations thereof. The dummy metallization 262 may be formed by depositing a seed layer over the encapsulant 126 and the integrated circuit devices 120, and then electroplating the conductive material onto the seed layer. The dummy metallization 262 may also be formed by sputtering the conductive material. The dummy metallization 262 is electrically isolated from the active and/or passive devices of the integrated circuit package 200. In some embodiments, the dummy metallization 262 includes a copper layer, a titanium layer on the copper layer, a nickel-vanadium layer on the titanium layer, and a gold layer on the nickel-vanadium layer, wherein the copper layer has a thickness of about 0.15 μm, the titanium layer has a thickness of about 0.1 μm, the nickel-vanadium layer has a thickness of about 0.3 μm, and the gold layer has a thickness of about 0.1 μm. Other metal layers may be utilized. For example, the dummy metallization 262 could also include a titanium/nickel/silver structure, a titanium/nickel/titanium/silver structure, a titanium/nickel/silver/nickel structure, a titanium/nickel/silver/tin structure, or the like. In some embodiments, the dummy metallization 262 has a total thickness of about 0.65 μm.

Figure 17:
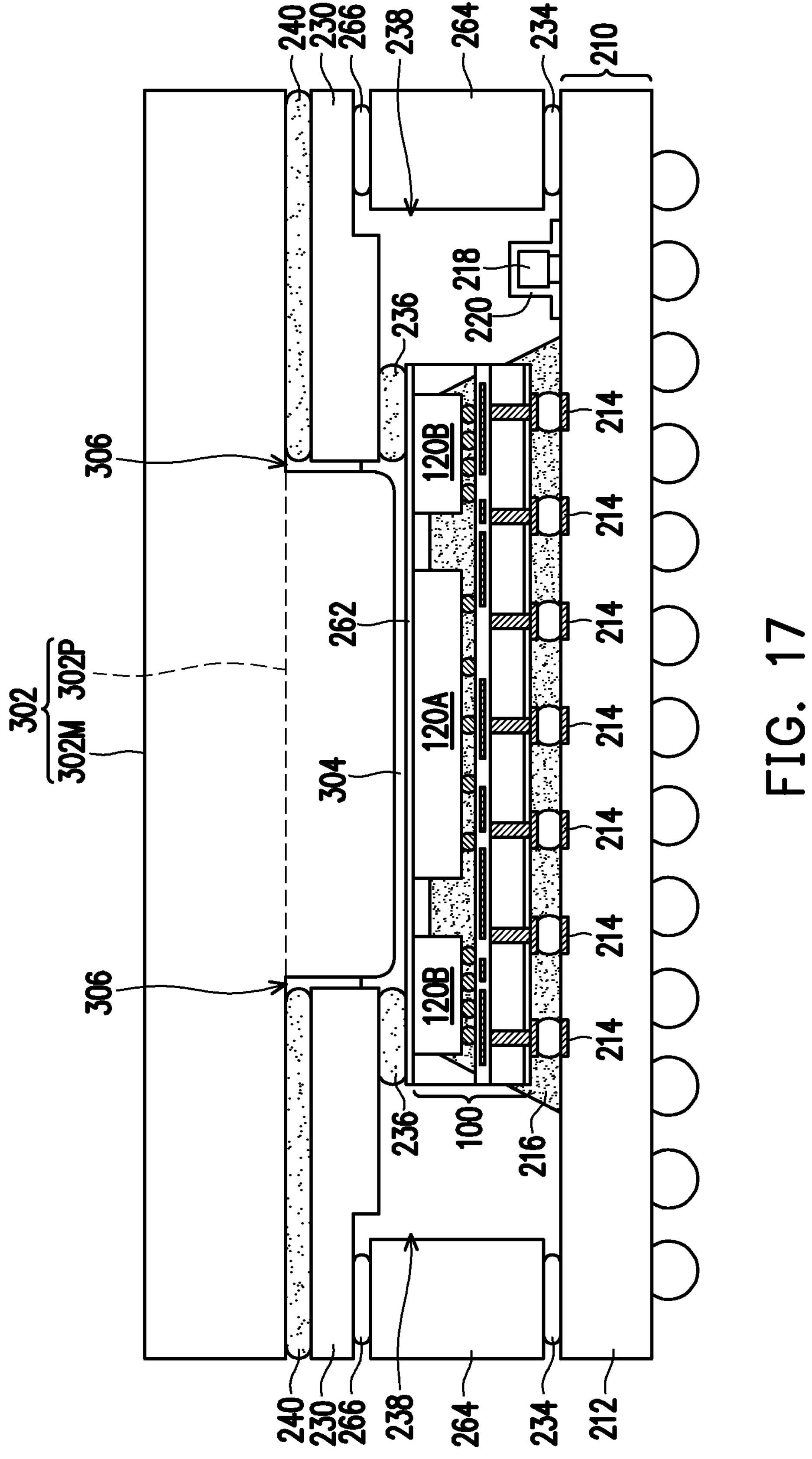
FIG. 17 is a cross-sectional view of a device implementing an integrated circuit package, in accordance with some embodiments.

FIG. 17 is a cross-sectional view of a device implementing an integrated circuit package 200, in accordance with some embodiments. This embodiment is similar to the embodiment of FIG. 16, except the package stiffener 230 is not directly attached to the package substrate 210. Instead, a ring 264 is attached to the package substrate 210 with the adhesive 234. The package stiffener 230 is attached to the ring 264. The package stiffener 230 may be attached to the ring 264 with an adhesive 266. The ring 264 may be formed of any of the candidate materials of the package stiffener 230. The adhesive 266 may be formed of any of the candidate materials of the adhesive 234. The ring 264 is formed of a different material than the package stiffener 230. The materials of the package stiffener 230 and the ring 264 may be selected to obtain a desired coefficient of thermal expansion. The package stiffener 230 is above and coupled to the ring 264 and to a periphery of the package component 100. The ring 264 is around the periphery of the package component 100 and coupled to the package substrate 210. The width of the package stiffener 230 is greater than the width of the ring 264. In this embodiment, the height of the package stiffener 230 is less than the height of the package component 100.

Figure 18:
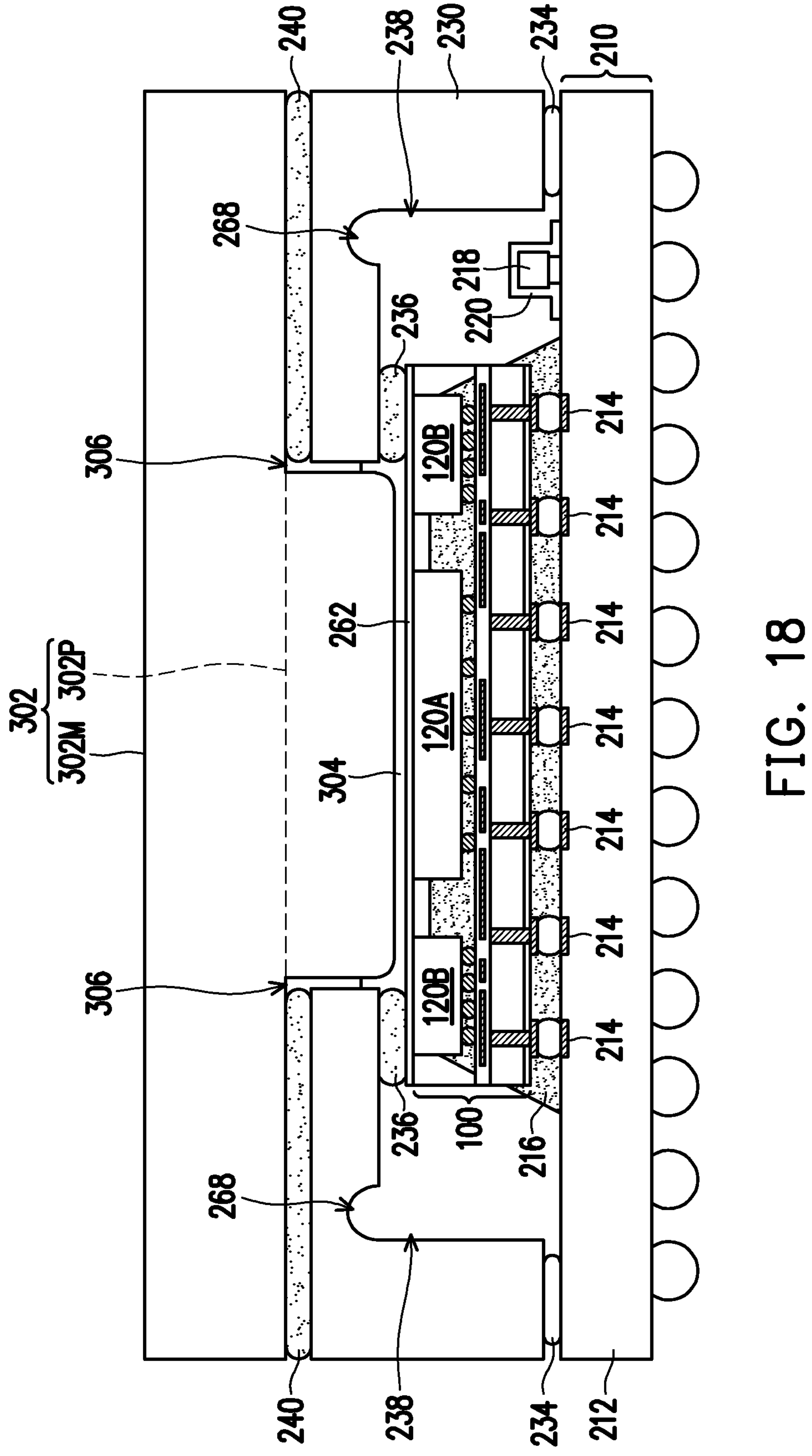
FIG. 18 is a cross-sectional view of a device implementing an integrated circuit package, in accordance with some embodiments.

FIG. 18 is a cross-sectional view of a device implementing an integrated circuit package 200, in accordance with some embodiments. This embodiment is similar to the embodiment of FIG. 16, except the package stiffener 230 has grooves 268 facing the package substrate 210. The grooves 268 are in areas of the package stiffener 230 that are thinner than areas of the package stiffener 230 without grooves. Forming the package stiffener 230 with thin areas allows it to have a deformable structure, which can help reduce the stress imparted on the package component 100 during mounting of the package stiffener 230 to the package component 100. The void 238 extends into the grooves 268.

Figure 19:
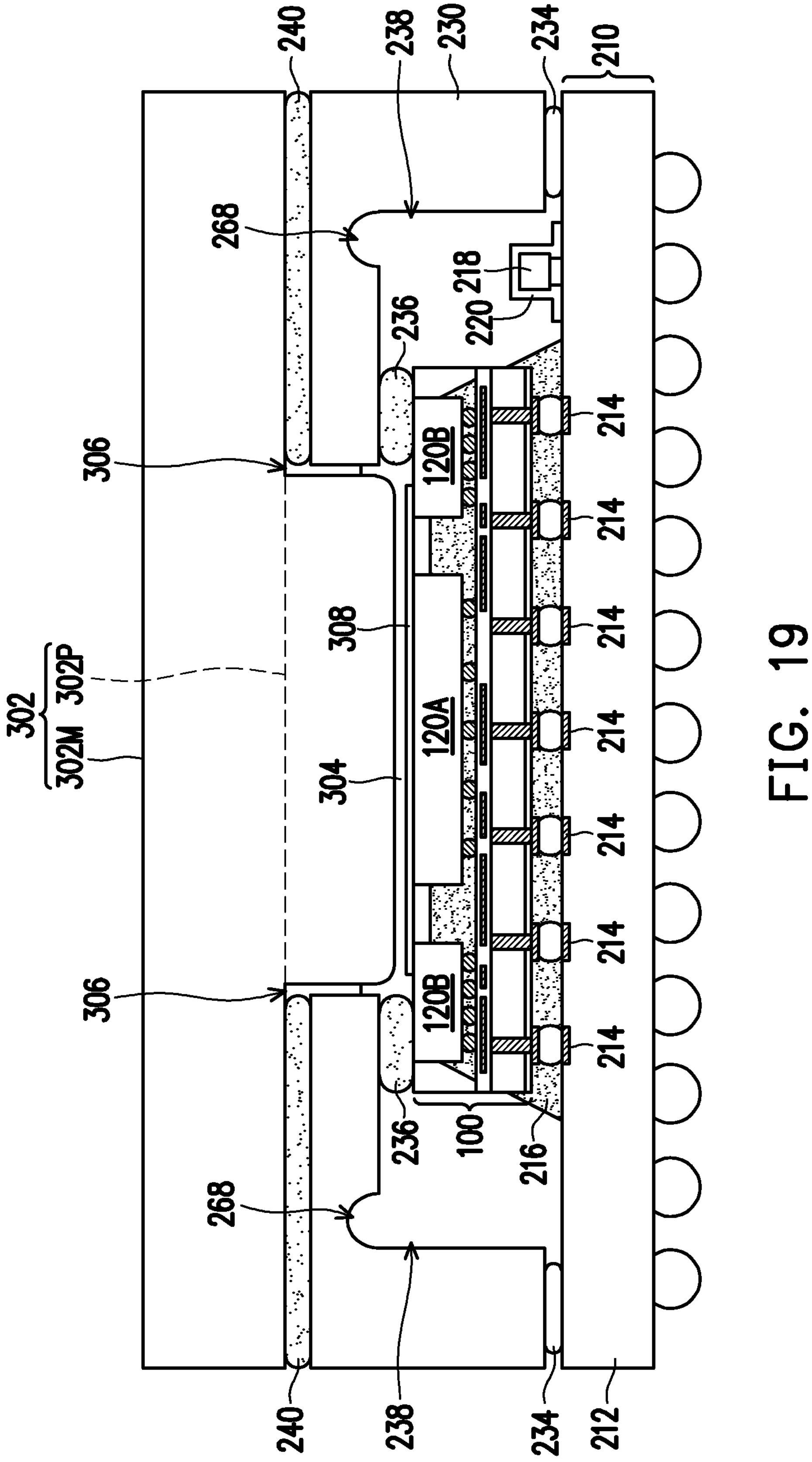
FIG. 19 is a cross-sectional view of a device implementing an integrated circuit package, in accordance with some embodiments.

FIG. 19 is a cross-sectional view of a device implementing an integrated circuit package 200, in accordance with some embodiments. This embodiment is similar to the embodiment of FIG. 18, except a wicking layer 308 is utilized in lieu of the dummy metallization 262. The thermal interface material 304 is dispensed on the wicking layer 308, such that the wicking layer 308 is between the thermal interface material 304 and at least a portion of the package component 100. The wicking layer 308 is a patterned sheet that has a pattern capable of impeding the flow of the thermal interface material 304. The thermal interface material 304 is thus at a reduced risk of flowing beneath the package stiffener 230, particularly when the thermal interface material 304 is a liquid metal. The wicking layer 308 may be a mesh or porous layer of a metal such as copper, gold, or the like. For example, the wicking layer 308 may be a grooved copper layer, a copper mesh layer, or a sintered copper layer. The wicking layer 308 is preformed with a desired shape, and is then attached to the package component 100. The wicking layer 308 may be disposed in the opening 232 (see FIG. 13) after the package stiffener 230 is attached to the package component 100, or may be disposed on the package component 100 before the package stiffener 230 is attached to the package component 100.

Figure 20:
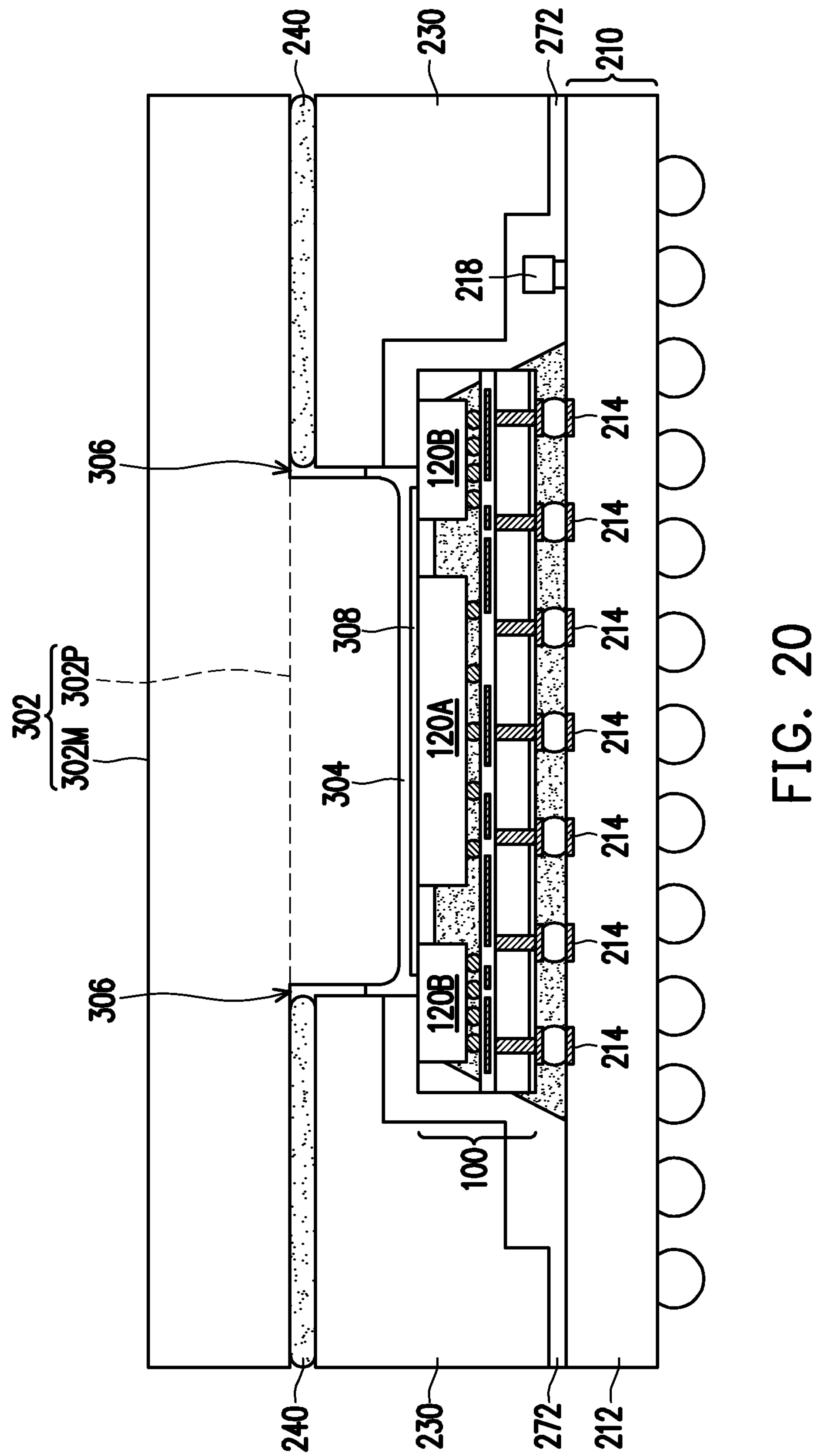
FIG. 20 is a cross-sectional view of a device implementing an integrated circuit package, in accordance with some embodiments.

FIG. 20 is a cross-sectional view of a device implementing an integrated circuit package 200, in accordance with some embodiments. This embodiment is similar to the embodiment of FIG. 19, except an encapsulant 272 is utilized lieu of the lower dam 236 and the adhesive 234. The encapsulant 272 is formed between the package stiffener 230 and the package substrate 210, the passive devices 218, and the package component 100. Accordingly, the encapsulant 272 completely fills the regions where the package stiffener 230 overlaps with the package component 100. The encapsulant 272 may be a molding compound, epoxy, or the like. The encapsulant 272 may be applied by compression molding, transfer molding, or the like. The encapsulant 272 may be applied in liquid or semi-liquid form and then subsequently cured. As a result of filling the area between the package stiffener 230 and the package substrate 210 with the encapsulant 272, the thermal interface material 304 may have a reduced risk of flowing to and shorting the passive devices 218. Additionally, the protective layers 220 may be omitted when the encapsulant 272 is utilized.

It should be appreciated that features may be included with or omitted from some embodiments, as appropriate. For example, the dummy metallization 262 may be omitted from the embodiments of FIGS. 17 and 18. Similarly, the grooves 268 may be omitted from the embodiment of FIG. 19.

In an embodiment, a device includes: an integrated circuit package including: a package component; and a package stiffener attached to the package component; and a heat spreader attached to the integrated circuit package, a main portion of the heat spreader disposed above the package stiffener, a protruding portion of the heat spreader extending through the package stiffener; an elastic adhesive material between the main portion of the heat spreader and the package stiffener; and a thermal interface material between the protruding portion of the heat spreader and the package component, the thermal interface material different from the elastic adhesive material. In some embodiments of the device, the thermal interface material is a liquid metal. In some embodiments of the device, the thermal interface material is a metal pad. In some embodiments of the device, the elastic adhesive material is graphite. In some embodiments of the device, the elastic adhesive material is a phase-change material. In some embodiments of the device, the thermal interface material extends along a bottom surface of the protruding portion of the heat spreader, along a sidewall of the protruding portion of the heat spreader, along a top surface of the package component, and along a sidewall of the package stiffener. In some embodiments, the device further includes: a wicking layer between the thermal interface material and the package component. In some embodiments of the device, the wicking layer includes a grooved copper layer, a copper mesh layer, or a sintered copper layer.

In an embodiment, a device includes: a package substrate; a package component attached to the package substrate, the package component including a logic device and memory devices; a first elastic dam on the package component, the first elastic dam overlapping the memory devices; a stiffener ring on the first elastic dam, the stiffener ring overlapping the memory devices; and an opening extending through the stiffener ring and the first elastic dam, the opening disposed above the logic device in a top-down view. In some embodiments of the device, the first elastic dam completely fills regions where the stiffener ring overlaps with the package component. In some embodiments, the device further includes: a second elastic dam on the stiffener ring, the opening extending through the second elastic dam. In some embodiments, the device further includes: a passive device attached to the package substrate, the stiffener ring overlapping the passive device. In some embodiments of the device, the opening exposes the logic device. In some embodiments, the device further includes: dummy metallization on the package component, the opening exposing the dummy metallization. In some embodiments of the device, the stiffener ring includes grooves facing the package substrate.

In an embodiment, a method includes: receiving an integrated circuit package including a package component and a package stiffener attached to the package component, where an opening in the package stiffener exposes a portion of the package component; dispensing a thermal interface material in the opening; and adhering a main portion of a heat spreader to the package stiffener with a first elastic adhesive material, a protruding portion of the heat spreader disposed in the opening and contacting the thermal interface material, the first elastic adhesive material sealing the opening to form a first void around the protruding portion of the heat spreader. In some embodiments, the method further includes: attaching the package component to a package substrate, the package component including a logic device and memory devices; and adhering the package stiffener to the package component with a second elastic adhesive material, the second elastic adhesive material and the package stiffener overlapping the memory devices, the opening disposed above the logic device in a top-down view. In some embodiments of the method, the second elastic adhesive material seals an area between the package substrate and the package stiffener to form a second void around the package component. In some embodiments, the method further includes: disposing a wicking layer in the opening, the thermal interface material dispensed on the wicking layer. In some embodiments of the method, dispensing the thermal interface material in the opening includes dispensing a liquid metal in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving an integrated circuit package comprising a package component and a package stiffener attached to the package component, wherein an opening in the package stiffener exposes a portion of the package component;
dispensing a thermal interface material in the opening; and
adhering a main portion of a heat spreader to the package stiffener with a first elastic adhesive material, a protruding portion of the heat spreader disposed in the opening and contacting the thermal interface material, the first elastic adhesive material sealing the opening to form a first void around the protruding portion of the heat spreader, wherein the thermal interface material extends along a bottom surface of the protruding portion of the heat spreader, along a sidewall of the protruding portion of the heat spreader, along a top surface of the package component, and along a sidewall of the package stiffener.

2. The method of claim 1, further comprising:
attaching the package component to a package substrate, the package component comprising a logic device and memory devices; and
adhering the package stiffener to the package component with a second elastic adhesive material, the second elastic adhesive material and the package stiffener overlapping the memory devices, the opening disposed above the logic device in a top-down view.

3. The method of claim 2, wherein the second elastic adhesive material seals an area between the package substrate and the package stiffener to form a second void around the package component.

4. The method of claim 1, further comprising:
disposing a wicking layer in the opening, the thermal interface material dispensed on the wicking layer.

5. The method of claim 1, wherein dispensing the thermal interface material in the opening comprises dispensing a liquid metal in the opening.

6. The method of claim 1, wherein the package component comprises integrated circuit devices, an encapsulant around the integrated circuit devices, and a dummy metallization on the encapsulant, the opening exposing the dummy metallization.

7. The method of claim 1, further comprising:
attaching the package component to a package substrate; and
adhering the package stiffener to the package component and the package substrate, the package stiffener comprising grooves facing the package substrate.

8. The method of claim 1, wherein the first elastic adhesive material comprises a phase-change material and a filler, the phase-change material being capable of changing from a solid to a viscous liquid.

9. The method of claim 1, wherein the opening in the package stiffener has a width less than a width of the package component and greater than a width of a logic device of the package component.

10. The method of claim 1, wherein the thermal interface material is different from the first elastic adhesive material.

11. A method comprising:
forming an integrated circuit package by:
attaching a package component to a package substrate, the package component comprising a logic device and memory devices; and
attaching a package stiffener to the package component, the package stiffener overlapping the memory devices in a top-down view, the package stiffener comprising an opening disposed above the logic device in the top-down view;
after attaching the package stiffener to the package component, dispensing a thermal interface material in the opening; and
attaching a heat spreader to the integrated circuit package, the heat spreader comprising a main portion and a protruding portion, wherein attaching the heat spreader comprises inserting the protruding portion into the opening and disposing the main portion above the package stiffener, wherein the thermal interface material extends along a bottom surface of the protruding portion of the heat spreader, along a sidewall of the protruding portion of the heat spreader, along a top surface of the package component, and along a sidewall of the package stiffener.

12. The method of claim 11, further comprising:
before attaching the heat spreader to the integrated circuit package, disposing a wicking layer in the opening, the wicking layer comprising a patterned sheet capable of impeding flow of the thermal interface material.

13. The method of claim 11, wherein attaching the heat spreader to the integrated circuit package comprises:
applying an elastic adhesive material between the main portion of the heat spreader and the package stiffener, the elastic adhesive material sealing an area between the heat spreader and the package component to create a void around the protruding portion of the heat spreader.

14. The method of claim 11, wherein attaching the package stiffener to the package component comprises:
applying an elastic adhesive material between the package stiffener and the package component, the elastic adhesive material completely filling regions where the package stiffener overlaps with the package component.

15. The method of claim 11, wherein a width of the opening is less than a width of the package component and greater than a width of the logic device.

16. The method of claim 11, wherein the thermal interface material has a higher thermal conductivity than the package stiffener.

17. A method comprising:
forming an integrated circuit package by:
forming a package component comprising an interposer and integrated circuit devices attached to the interposer;
attaching a package stiffener to the package component with an elastic adhesive material, the package stiffener comprising an opening disposed above the integrated circuit devices, the elastic adhesive material completely filling regions where the package stiffener overlaps with the package component;
dispensing a thermal interface material in the opening and on the integrated circuit devices, the thermal interface material and the elastic adhesive material being different material compositions; and
attaching a heat spreader to the integrated circuit package, the heat spreader comprising a main portion and a protruding portion, wherein attaching the heat spreader comprises inserting the protruding portion into the opening and disposing the main portion above the package stiffener, the protruding portion of the heat spreader being contacted to the thermal interface material.

18. The method of claim 17, wherein the elastic adhesive material comprises a phase-change material and a filler, the phase-change material being capable of changing from a solid to a viscous liquid.

19. The method of claim 17, further comprising:

disposing a wicking layer in the opening and on the integrated circuit devices, wherein the thermal interface material is dispensed on the wicking layer, the wicking layer comprising a patterned sheet capable of impeding flow of the thermal interface material.

20. The method of claim 17, wherein the thermal interface material extends along a bottom surface of the protruding portion of the heat spreader, along a sidewall of the protruding portion of the heat spreader, along a top surface of the package component, and along a sidewall of the package stiffener.

* * * * *